(12) United States Patent
Zhu

(10) Patent No.: US 9,490,212 B2
(45) Date of Patent: Nov. 8, 2016

(54) HIGH QUALITY ELECTRICAL CONTACTS BETWEEN INTEGRATED CIRCUIT CHIPS

(76) Inventor: Huilong Zhu, Poughkeepsie, NY (US)

(*) Notice: Subject to any disclaimer, the term of this patent is extended or adjusted under 35 U.S.C. 154(b) by 487 days.

(21) Appl. No.: 12/798,173

(22) Filed: Mar. 31, 2010

(65) Prior Publication Data

US 2010/0270674 A1 Oct. 28, 2010

Related U.S. Application Data

(60) Provisional application No. 61/214,366, filed on Apr. 23, 2009.

(51) Int. Cl.
*H01L 23/48* (2006.01)
*H01L 23/485* (2006.01)
(Continued)

(52) U.S. Cl.
CPC ......... *H01L 23/5329* (2013.01); *H01L 23/522* (2013.01); *H01L 24/11* (2013.01); *H01L 24/13* (2013.01); *H01L 24/94* (2013.01); *H01L 25/0657* (2013.01); *H01L 25/50* (2013.01); *H01L 21/76807* (2013.01); *H01L 23/481* (2013.01); *H01L 24/05* (2013.01); *H01L 24/81* (2013.01); *H01L 2224/0401* (2013.01); *H01L 2224/05006* (2013.01); *H01L 2224/05026* (2013.01); *H01L 2224/05546* (2013.01); *H01L 2224/05554* (2013.01); *H01L 2224/05571* (2013.01); *H01L 2224/05647* (2013.01); *H01L 2224/1308* (2013.01); *H01L 2224/13017* (2013.01); *H01L 2224/13018* (2013.01); *H01L 2224/13083* (2013.01); *H01L 2224/13099* (2013.01); *H01L 2224/13147* (2013.01); *H01L 2224/8012* (2013.01); *H01L 2224/80895* (2013.01); *H01L 2224/80896* (2013.01); *H01L 2224/81097* (2013.01); *H01L 2224/81099* (2013.01); *H01L 2224/81208* (2013.01); *H01L 2225/06513* (2013.01); *H01L 2225/06527* (2013.01); *H01L 2225/06541* (2013.01); *H01L 2924/0002* (2013.01); *H01L 2924/00013* (2013.01); *H01L 2924/0103* (2013.01); *H01L 2924/0104* (2013.01); *H01L 2924/014* (2013.01); *H01L 2924/01005* (2013.01); *H01L 2924/01006* (2013.01); *H01L 2924/01013* (2013.01); *H01L 2924/01018* (2013.01); *H01L 2924/01019* (2013.01); *H01L 2924/01022* (2013.01); *H01L 2924/01023* (2013.01); *H01L 2924/01024* (2013.01); *H01L 2924/01029* (2013.01); *H01L 2924/01042* (2013.01);
(Continued)

(58) Field of Classification Search
CPC .......... H01L 2224/81208; H01L 2225/06527; H01L 2224/02335; H01L 23/5226
USPC .................................. 257/758–760
See application file for complete search history.

(56) References Cited

U.S. PATENT DOCUMENTS

| 5,625,232 A * | 4/1997 | Numata | ............... H01L 23/3677 257/752 |
| 5,936,843 A * | 8/1999 | Ohshima | ................ H05K 1/141 174/250 |

(Continued)

*Primary Examiner* — Raj R Gupta
(74) *Attorney, Agent, or Firm* — Troutman Sanders LLP

(57) ABSTRACT

Methods and structures of connecting at least two integrated circuits in a 3D arrangement by a zigzag conductive chain are disclosed. The zigzag conductive chain, acting as a spring or self-adaptive contact structure (SACS) in a wafer bonding process, is designed to reduce bonding interface stress, to increase bonding interface reliability, and to have an adjustable height to close or eliminate undesirable opens or voids between two integrated circuits.

17 Claims, 34 Drawing Sheets

(51) Int. Cl.
*H01L 23/498* (2006.01)
*H01L 21/60* (2006.01)
*H01L 23/532* (2006.01)
*H01L 23/522* (2006.01)
*H01L 25/065* (2006.01)
*H01L 25/00* (2006.01)
*H01L 21/768* (2006.01)
*H01L 23/00* (2006.01)

(52) U.S. Cl.
CPC ............ *H01L 2924/01046* (2013.01); *H01L 2924/01072* (2013.01); *H01L 2924/01073* (2013.01); *H01L 2924/01074* (2013.01); *H01L 2924/01078* (2013.01); *H01L 2924/01079* (2013.01); *H01L 2924/04941* (2013.01); *H01L 2924/10252* (2013.01); *H01L 2924/10253* (2013.01); *H01L 2924/10271* (2013.01); *H01L 2924/14* (2013.01); *H01L 2924/19041* (2013.01); *H01L 2924/19043* (2013.01); *H01L 2924/30105* (2013.01)

(56) References Cited

U.S. PATENT DOCUMENTS

| | | | |
|---|---|---|---|
| 6,521,970 B1* | 2/2003 | Takiar | H01L 23/3114 257/522 |
| 7,518,398 B1 | 4/2009 | Rahman et al. | |
| 2002/0146919 A1* | 10/2002 | Cohn | B81B 7/0006 439/66 |
| 2003/0139029 A1* | 7/2003 | Haba | H01L 21/283 438/612 |
| 2004/0259353 A1* | 12/2004 | Engbrecht | H01L 21/318 438/687 |
| 2005/0124181 A1* | 6/2005 | Brown | H01L 24/72 439/66 |
| 2006/0180930 A1* | 8/2006 | Nguyen | H01L 23/5226 257/758 |
| 2006/0189121 A1* | 8/2006 | Muthukumar | H01L 21/486 438/618 |
| 2009/0243046 A1 | 10/2009 | Shi et al. | |
| 2009/0294974 A1 | 12/2009 | Leung et al. | |
| 2010/0032764 A1 | 2/2010 | Andry et al. | |

* cited by examiner

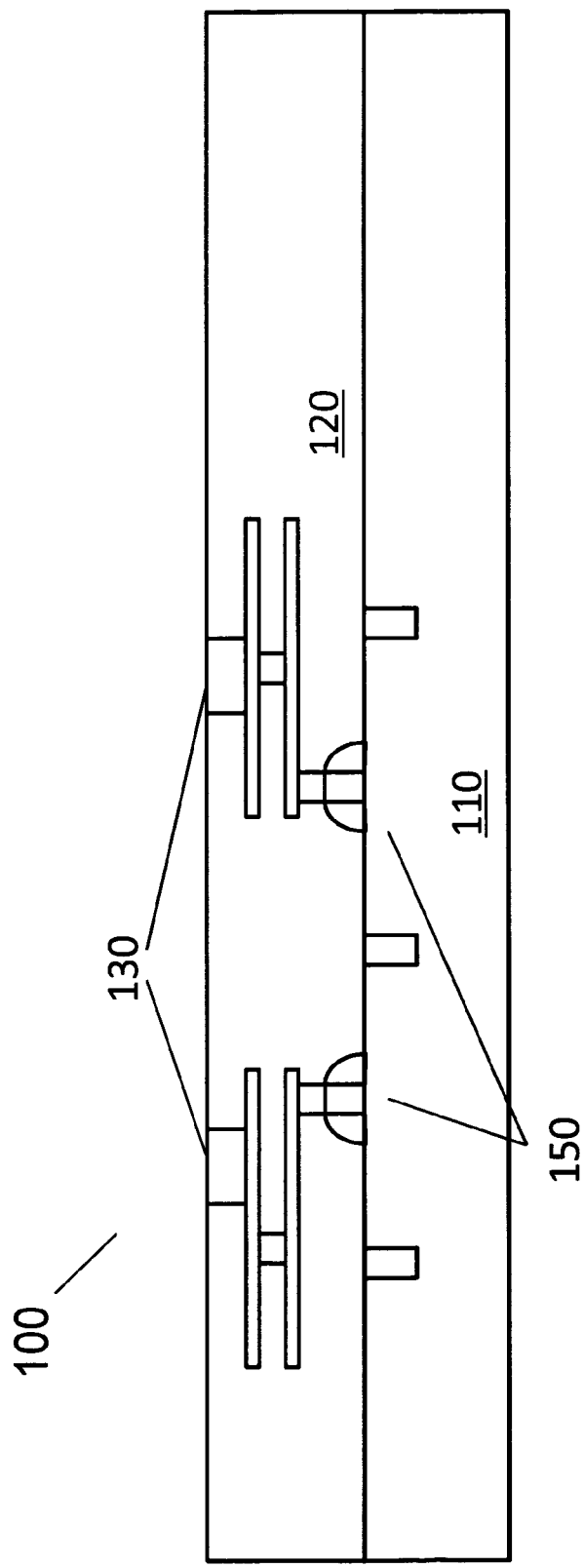

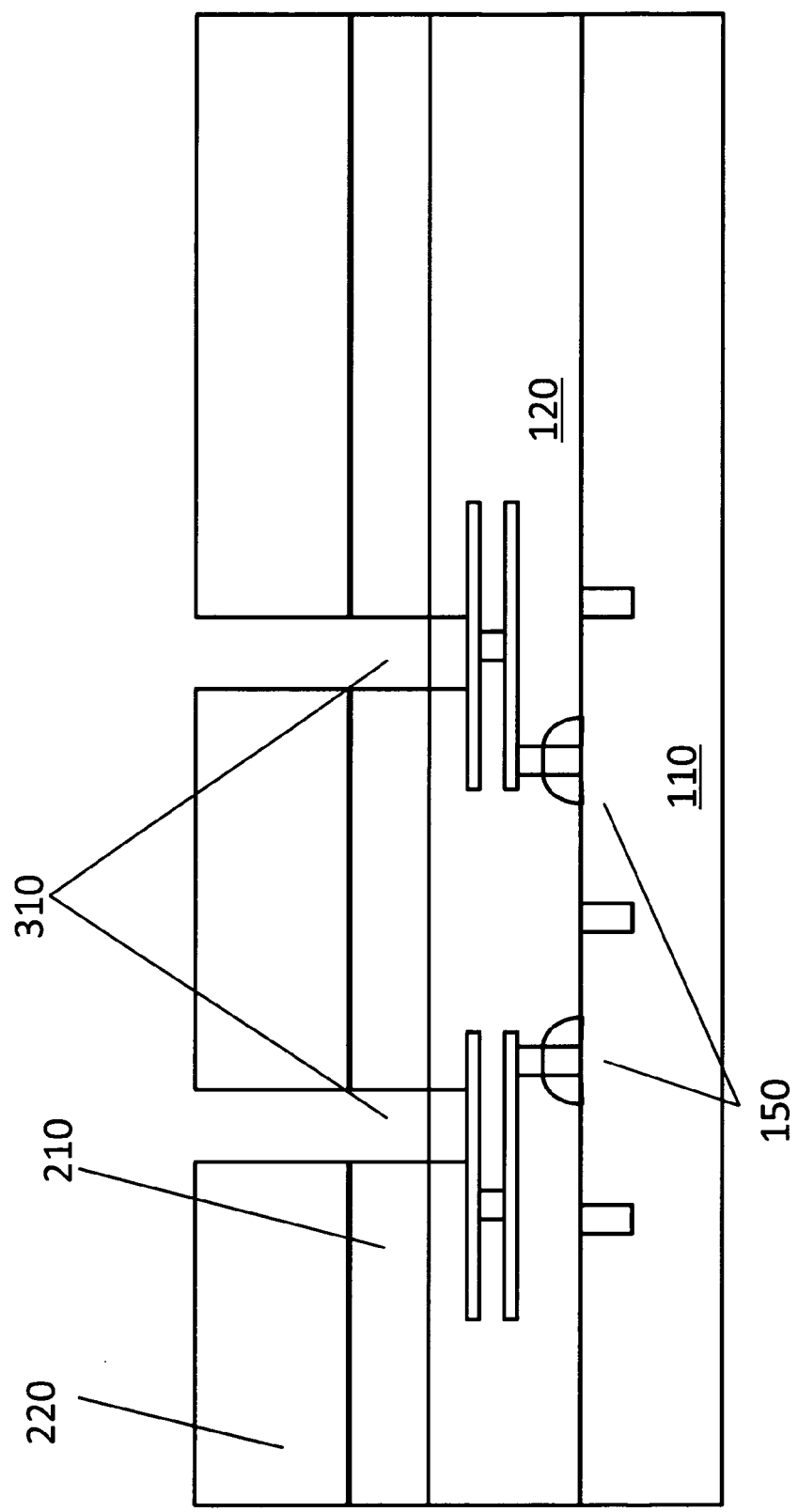

HIGH QUALITY ELECTRICAL CONTACTS BETWEEN INTEGRATED CIRCUIT CHIPS

This non-provisional application claims the benefit of the provisional application filed with the United States Patent and Trademark Office as Ser. No. 61/214,366 entitled "HIGH QUALITY ELECTRICAL CONTACTS BETWEEN INTEGRATED CIRCUIT CHIPS" filed on Apr. 23, 2009.

BACKGROUND OF THE INVENTION

The present invention relates generally to three dimensional (3D) integrated circuits, more particularly to 3D integrated circuits with through semiconductor vias, and methods of manufacturing the same.

To reduce manufacturing costs and improve integrated circuit performance, the semiconductor industry has experienced continuous increasing of the integration density of various electronic components or reducing the minimum feature size of various electronic components (i.e., transistors, diodes, resistors, capacitors, etc.). For the most part, the increasing of integrated circuit (IC) is essentially two-dimensional (2D) in nature since it is easy to manufacture. For last four decades, the scaling down of the minimum feature size of electronic devices relies on improvements in lithography technology. However, there are physical limits to both lithography technology and the minimum device size. In addition, when the number of devices in an IC increases, the length of interconnections among devices increase dramatically. In this case, it is difficult to meet the requirements for bandwidth, resistance-capacitance (RC) delay and power consumption.

The limitations and difficulties mentioned-above can be solved by introducing three-dimensional (3D) integrated circuits. 3D integration provides significant benefits in terms of transistor density and wire reduction. A typical 3D integration process is bonding two 2D IC chips together with chip-to-chip or chip-to-wafer or wafer-to-wafer bonding. Typical interconnections between the ICs in the two 2D IC chips are so-called through-semiconductor-vias, which go through at least one of the two 2D IC chips.

Since multiple chips can be stacked together to form a 3D IC, the integration density of devices in the 3D IC is much higher than 2D ICs and the interconnect length in the 3D IC is much shorter than 2D ICs. In addition, before 2D IC chips are bonded together, they can be tested to check if they are in good conditions or satisfy 3D integration requirements. To improve yields of 3D ICs, the 2D IC chips that meet 3D integration requirements are selected to bond together. Therefore, 3D ICs can be used to reduce IC manufacturing costs, increase IC performance and improve chip yields. It is also the potential to be the next generation of mainstream IC technology.

Various 3D integrated circuits have been proposed by Rahman et al U.S. Pat. No. 7,518,398, Leung et al U.S. Patent Application Publication US2009/0294974, Andry et al U.S. Patent Application Publication US2010/0032764, Shi et al U.S. Patent Application Publication US2009/0243046, Puttaswamy et al, "Implementing Caches in a 3D Technology for High Performance Processors," ICCD, pp. 525-532, 2005 International Conference on Computer Design (2005), and Burns et al., "A Wafer-Scale 3-D Circuit Integration Technology", IEEE Transactions on Electron Devices, 53, No. 10 (2006), pp 2507-2516, the disclosures of which are incorporated by reference herein.

Of the foregoing references, Rahman et al U.S. Pat. No. 7,518,398 discloses forming through via connections between two ICs. Leung et al U.S. Patent Application Publication US2009/0294974 discloses a bonding method for through-silicon-via bonding of a wafer stack in which the wafers are formed with through-silicon-vias and lateral microchannels that are filled with solder. Andry et al U.S. Patent Application Publication US2010/0032764 discloses a structure of conductive through-silicon-vias that are formed by using dummy poly-silicon vias. Shi et al U.S. Patent Application Publication US2009/0243046 discloses a method of forming a through-silicon-via to form an interconnect between two stacked semiconductor components using pulsed laser energy. Puttaswamy et al paper discussed the benefits of 3D integrated circuit, and Burns et al paper disclose the formation of through vias that connect two levels of metal wherein the vias are formed through the silicon after the wafers are bonded.

A 3D integrated circuit usually is formed by bonding two or more patterned wafers together to make electrical contacts among the ICs in different wafers. It is difficult to obtain high quality bonding interfaces and good electrical contacts with patterned wafers due to non-uniformity and heterogeneity in the bonding interfaces. There exists a need for a 3D semiconductor structure in which un-uniformity and heterogeneity of bonding interfaces does not adversely impact electrical contacts that are formed by bonding two wafers or chips.

BRIEF SUMMARY OF THE INVENTION

The present invention addresses the needs described above by providing a 3D semiconductor structure comprising at least one self-adaptive contact structure (SACS) in a first chip that can adjust its position to make contact with an interconnect in a second chip in a bonding process of wafer-to-wafer or chip-to-wafer or chip-to-chip. The various advantages and purposes of the present invention as described above and hereafter are achieved by providing, according to a first aspect of the invention, a method of making 3D integrated circuits, comprising the steps of:

forming devices and back end of the line (BEOL) wiring on a first side of a first semiconductor wafer;

forming a first component for at least one SACS by 1) forming at least one first metal-filled via which its first end connects to the devices or BEOL of the first semiconductor wafer, 2) forming at least one first electrically conductive bar which its first end electrically connects to the second end of the first metal-filled via and its second end at least partially extends in a first direction that is approximately perpendicular to the first metal-filled via;

if necessary, repeating the process steps mentioned-above to form a second component for the SACS by 1) forming at least one second metal-filled via which its first end connects to the second end of the first electrically conductive bar, 2) forming at least one second electrically conductive bar which its first end connects to the second end of the second metal-filled via and its second end at least partially extends in a second direction that is approximately perpendicular to the second metal-filled via;

if necessary, repeating the process steps mentioned-above to build multiple components for the SACS and construct at least one SACS of which one end can be adjusted in a certain range if it becomes a free-standing SACS as described in next two steps;

removing the part of materials surrounding at least one SACS to form at least one free-standing SACS which its first end connects to the devices or BEOL of the first semiconductor wafer and its second end have at least one exposed conductor surface that can be used to connect to devices or BEOL on other chips or semiconductor wafers;

etching and recessing down the surfaces of materials on the first side of the first semiconductor wafer, except the top surfaces of SACSs, to form a surface structure that at least one top surface of the second end or free end of free-standing SACSs is higher than or protrudes out from the rest of surfaces.

obtaining a second semiconductor wafer having device and BEOL wiring, the device and BEOL wiring having at least one exposed conductor surface;

pressing together at least one exposed conductor surface of the devices or BEOL of the second chip or semiconductor wafer with at least one exposed conductor surface of the second end of the free-standing SACSs on the first semiconductor wafer;

bonding at least one exposed conductor surface of the second end of the free-standing SACSs and some of other exposed surfaces on the first side of the first semiconductor wafer to at least one exposed conductor surface of the devices or BEOL of the second chip or semiconductor wafer to form at least one electrical contact between the free-standing SACSs in the first semiconductor wafer and exposed conductor surface on the second chip or semiconductor wafer.

According to a second aspect of the invention, there is provided a method of making 3D integrated circuits, comprising the steps of:

forming devices and back end of the line (BEOL) wiring on a first side of a first semiconductor wafer;

forming a first component for at least one SACS by 1) forming at least one first metal-filled via which its first end connects to the devices or BEOL of the first semiconductor wafer, 2) forming at least one first electrically conductive bar which its first end connects to the second end of the first metal-filled via and its second end at least partially extends in a first direction that is perpendicular to the first metal-filled via;

if necessary, repeating the process steps mentioned-above to form a second component for the SACS by 1) forming at least one second metal-filled via which its first end connects to the second end of the first electrically conductive bar, 2) forming at least one second electrically conductive bar which its first end connects to the second end of the second metal-filled via and its second end at least partially extends in a second direction that is perpendicular to the second metal-filled via;

if necessary, repeating the process steps mentioned-above to build multiple components for the SACS and construct at least one SACS;

removing the part of materials surrounding at least one SACS;

forming at least one free-standing SACS which its first end connects to the devices or BEOL of the first semiconductor wafer and its second end have at least one exposed conductor surface that can be used to connect to devices or BEOL on other chips or semiconductor wafers;

etching and recessing down the exposed surfaces of the materials on the first side of the first semiconductor wafer, except the top surfaces of SACSs, to form a surface structure that at least one exposed conductor surface of the second end of free-standing SACSs is higher than or protrudes out from all surfaces other than the exposed conductor surfaces of the second end of free-standing SACSs.

obtaining a second semiconductor wafer having device and BEOL wiring, the device and BEOL wiring having at least one exposed conductor surface;

pressing together at least one exposed conductor surface of the devices or BEOL of the second chip or semiconductor wafer with at least one exposed conductor surface of the second end of the free-standing SACSs on the first semiconductor wafer;

bonding at least one exposed conductor surface of the second end of the free-standing SACSs and some of other exposed surfaces on the first side of the first semiconductor wafer to at least one exposed conductor surface of the devices or BEOL of the second chip or semiconductor wafer to form at least one electrical contact between the free-standing SACSs in the first semiconductor wafer and exposed conductor surface on the second chip or semiconductor wafer.

filling the gaps around the free-standing SACSs with insulative materials.

According to a third aspect of the invention, there is provided a 3D integrated circuit comprising:

a first integrated circuit having at least one zigzag connection structure mechanically and electrically joined to a second integrated circuit having a connection pad wherein the zigzag connection structure is pressed and, comparing to prior arts, the significant part of the zigzag connection structure is sufficiently deformed after joining the first and second integrated circuits together.

According to a fourth aspect of the invention, there is provided a 3D integrated circuit comprising:

a first integrated circuit having at least one zigzag conductive chain mechanically and electrically joined to a second integrated circuit; a first end of the at least one zigzag conductive chain approximately aligning to a second end of the at least one zigzag conductive chain.

BRIEF DESCRIPTION OF THE DRAWINGS

The features of the invention are believed to be novel and the element characteristics of the invention are set forth with particularity in the appended claims.

The figures are for illustration purposes only and are not drawn to scale. The invention itself, however, both as to organization and method of operation, will best be understood by reference to the following detailed description taken in conjunction with the accompanying drawings in which:

FIGS. 1 to 15 are top and cross sectional views which illustrate the various process steps in forming a 3D integrated circuit according to the present invention. FIGS. 12(*a*), 12(*b*), and 15 are cross sectional views illustrating the final structure achieved according to the present invention.

DETAILED DESCRIPTION OF THE INVENTION

When semiconductor chips or integrated circuits (hereafter referred to as just "integrated circuits") are joined to form a 3D structure, it is necessary to form electrical contacts to make the various connections between integrated circuits. A 3D integrated circuit usually is fabricated by joining together two or more patterned chips or wafers to form electrical contacts to make the various connections between integrated circuits in the patterned chips or wafers. However, it is difficult to obtain high quality electrical contacts with patterned wafers due to un-uniformity and heterogeneity in the bonding interfaces. Electrical opens occur in the bonding interfaces since voids and bubbles are formed during wafer bonding processes. There exists a need for a 3D semiconductor structure in which un-uniformity and heterogeneity of bonding interfaces does not adversely impact electrical contacts that are formed by bonding two wafers or chips. The present invention relates to an improved process and structure for forming electrical contacts in a wafer-to-wafer or chip-to-wafer or chip-to-chip bonding process.

In a conventional wafer bonding process for forming a 3D IC, it is preferred to bond together two exposed flat surfaces of two 2D IC chips to form the 3D IC. However, it is impossible to have perfect flat surface due to process variation and process defects. Stresses produced by various processes (film deposition, thermal treatment, and patterned surface) can also cause wafer or chip deformation, which adversely impacts on the reliability of electrical contacts of a 3D IC. The present invention discloses a bonding process and a self-adaptive connection structure for forming improved electrical contacts in a 3D IC formed by a wafer-to-wafer or chip-to-wafer or chip-to-chip bonding process. Unlike conventional wafer bonding processes disclosed in prior arts, the present invention relates to bond the non-planar exposed surface of a first wafer or chip to the non-planar exposed surface or a flat surface of a second wafer or chip to improve electrical connectivity between the two wafers or chips. The non-planar exposed surface of the first wafer or chip has the ability of self-adapting its surface topologic to make contact with the exposed surface of the second wafer or chip, which improves electrical connectivity between the first wafer or chip and the second wafer or chip.

Figure 1A:
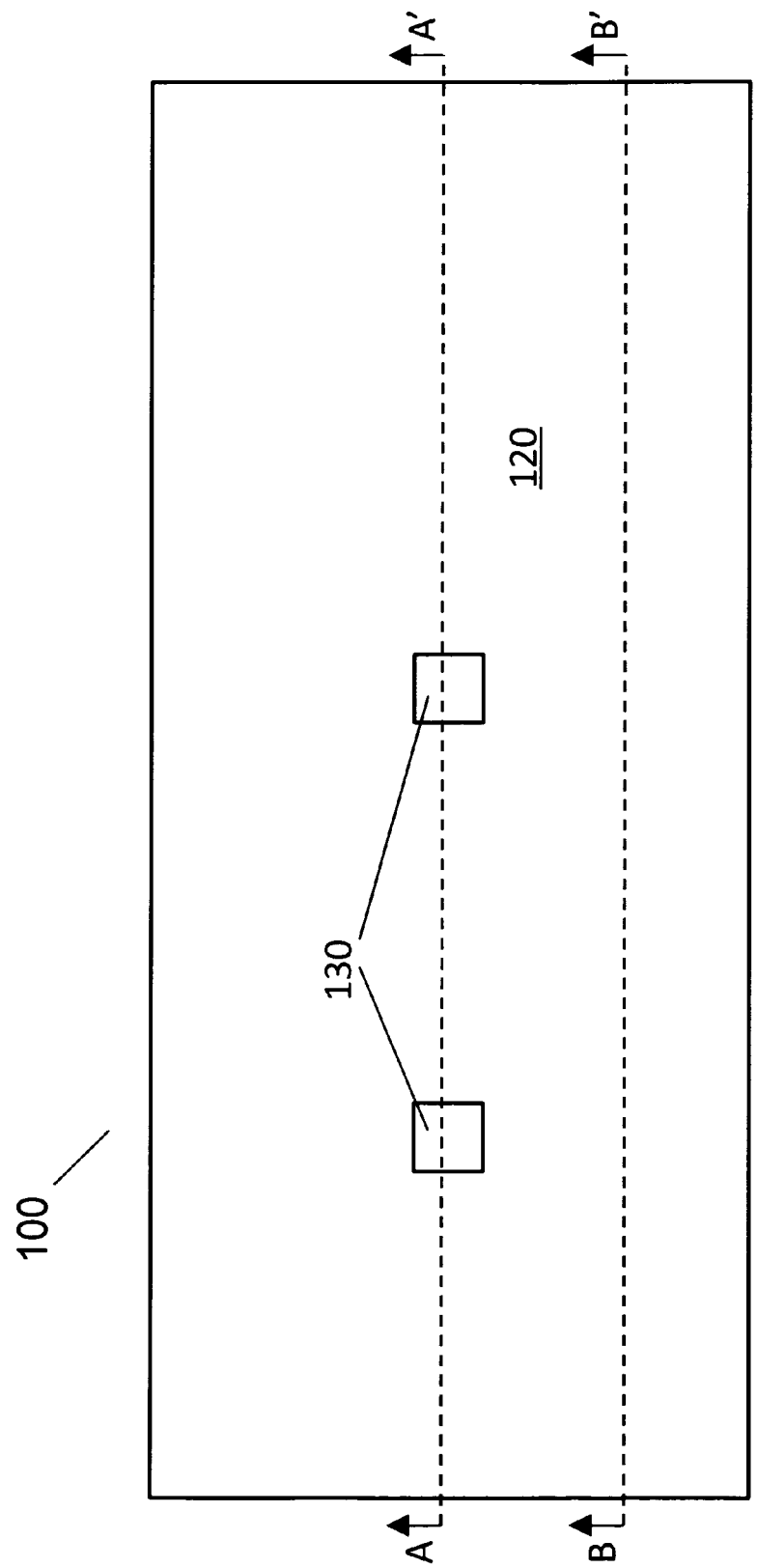
Figure 1C:
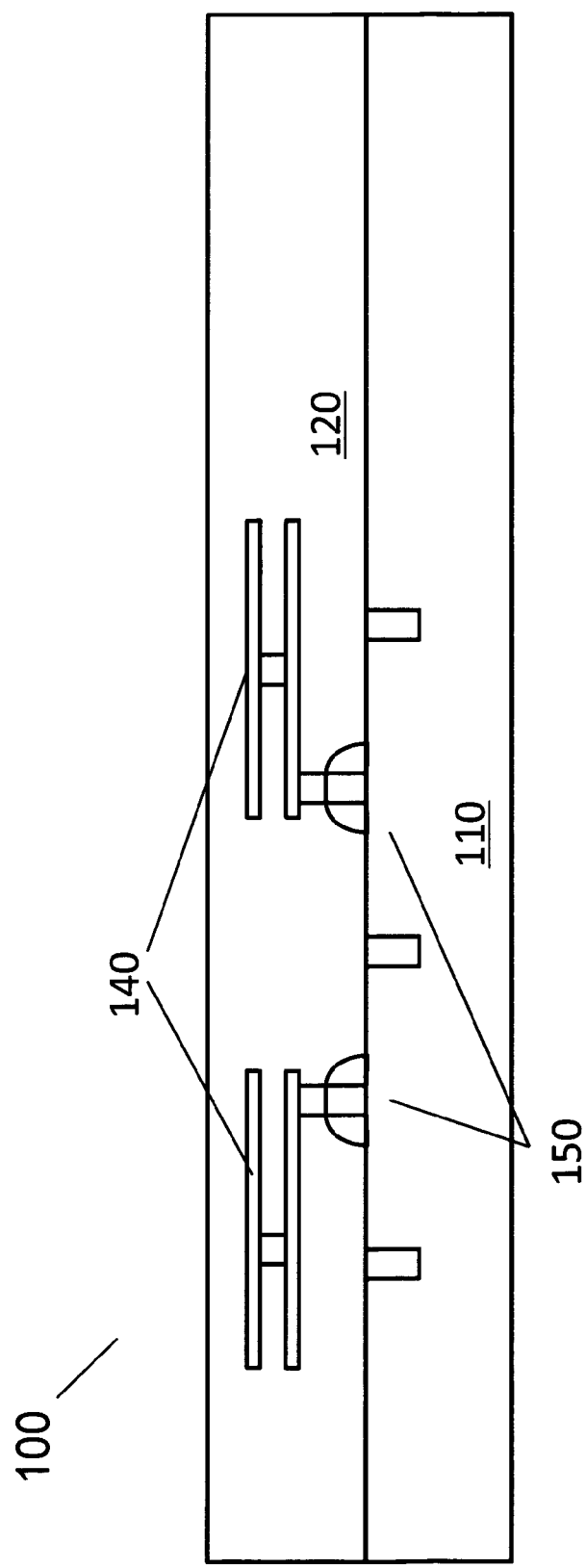

Referring now to the drawings in more detail, FIG. 1(a) showing the top view of a first semiconductor structure 100, FIG. 1(b) showing a cross-section cutting along A-A' shown in FIG. 1(a), and FIG. 1(c) showing a cross-section cutting along B-B' shown in FIG. 1(a). Particularly referring to FIGS. 1(a), 1(b) and 1(c) there are illustrated the first semiconductor structure 100 having semiconductor substrate 110, having insulative dielectric 120, having electrical conductive via 130, having interconnect 140, and electrical active devices 150. The semiconductor substrate 110 useful for the present invention is any semiconductor material including but not limited to group IV semiconductors such as silicon, silicon germanium, or germanium, a III-V compound semiconductor, or a II-VI compound semiconductor and combination thereof. The insulative dielectric 120 useful for the present invention is any insulative material including but not limited to SiO2, Si3N4 and combination thereof. The electrically conductive via 130 useful for the present invention is preferably 60-60000 nm in size and is any conductive material including but not limited to doped poly silicon, Al, W, Cu and combination thereof. The interconnect 140 useful for the present invention is any electrically conductive material including but not limited to doped poly silicon, Al, W, Cu and combination thereof. The electrically active devices 150 useful for the present invention is any kind of devices including but not limited to MOSFEF, BJT, DRAM, flash memory, Fine, tri-gate FET, PCM and combination thereof.

Figure 2A:
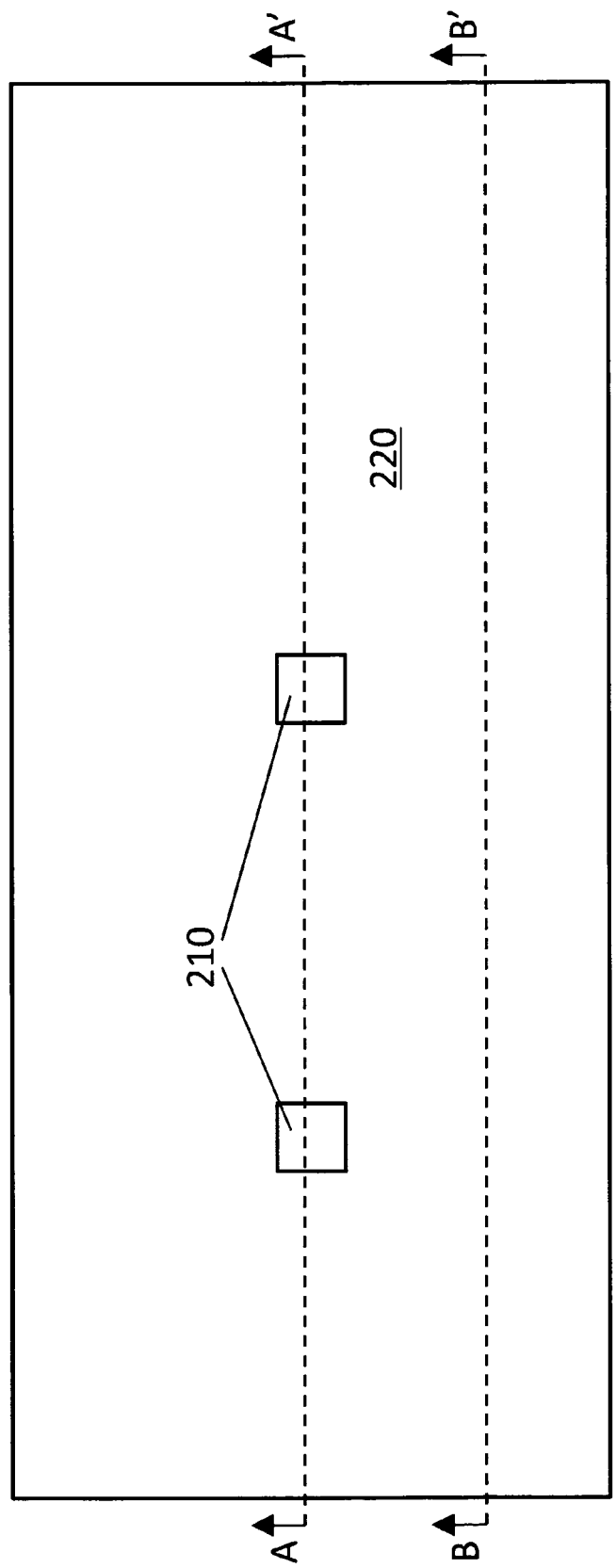
Figure 2B:
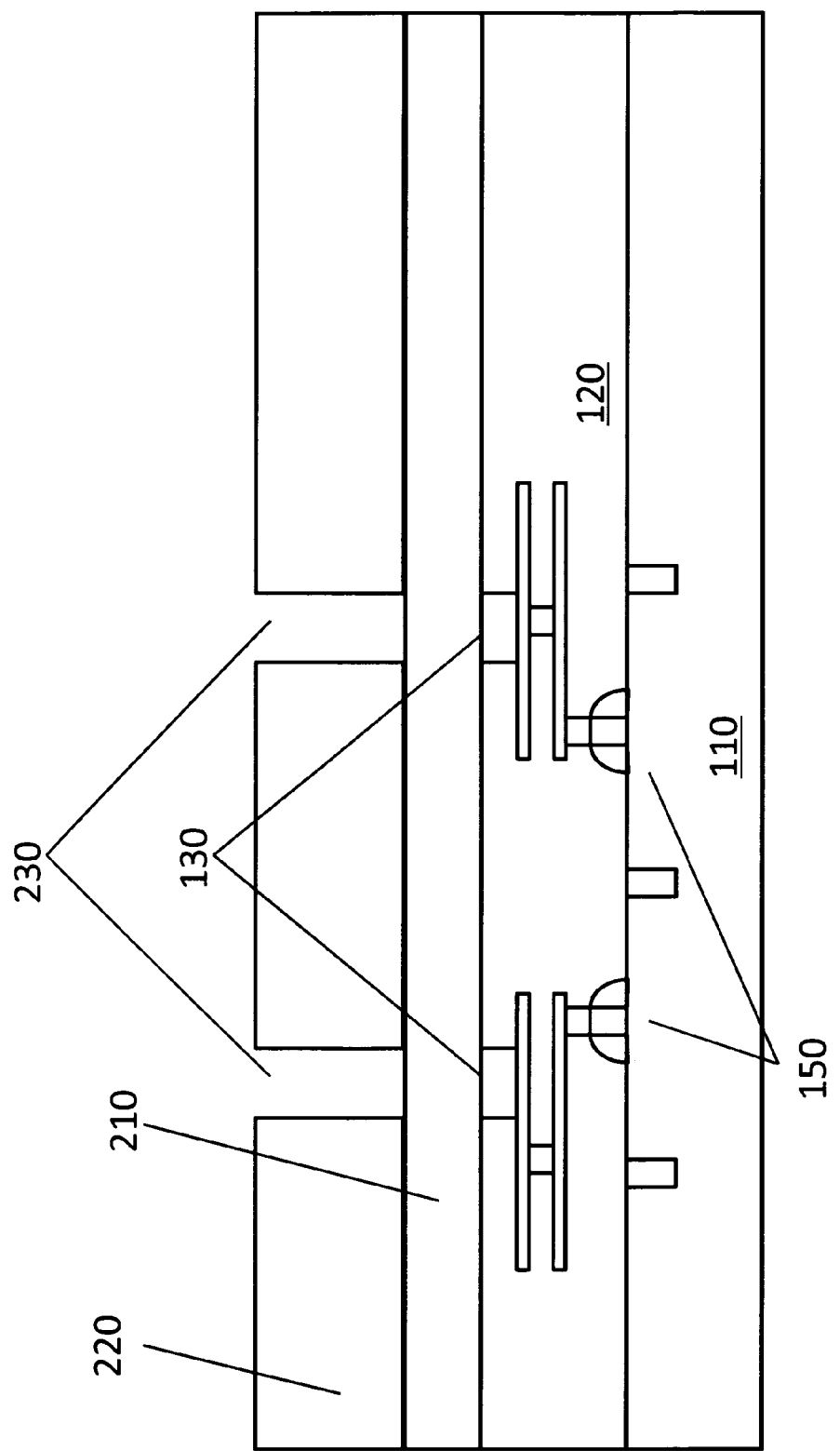
Figure 2C:
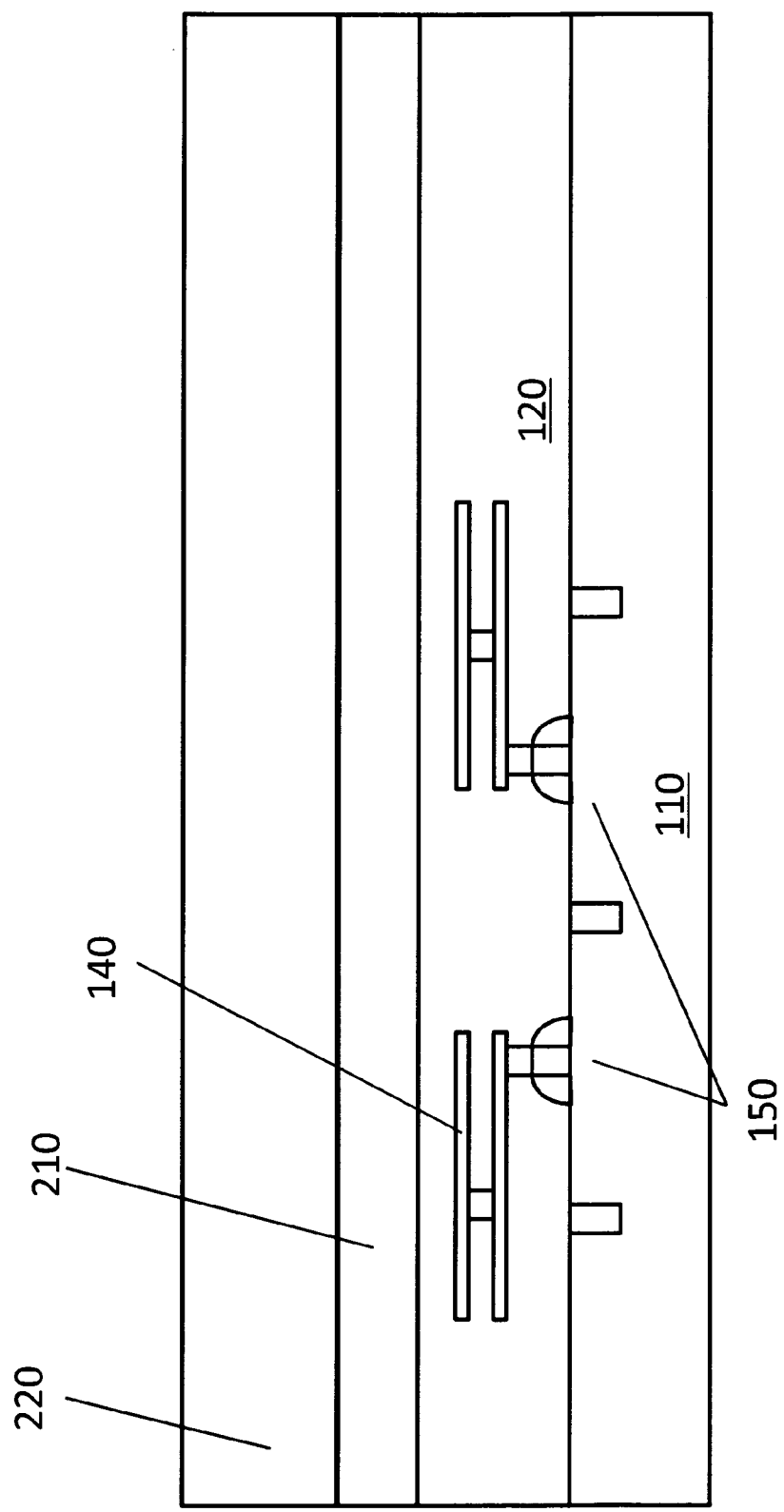

Referring now to FIGS. 2(a), 2(b), and 2(c), a nitride film 210 is deposited (preferably 50-50000 nm thick) and patterned photo-resist 220 with openings 230 (preferably 500-50000 nm in size) aligning with the vias 130 is formed on the top of the nitride film 210. In more detail, after the deposition and patterning, FIG. 2(a) shows the top view and FIG. 2(b) shows a cross-section cutting along A-A' shown in FIG. 2(a), and FIG. 2(c) shows a cross-section cutting along B-B' shown in FIG. 2(a). The nitride 210 is deposited by any method including but not limited to CVD, PECVD, and ALD. The patterned photo-resist 220 is formed by a conventional lithographic method. In one embodiment, the nitride film 210 can be replaced by any insulative material including but not limited to SiO2, Fluorine Doped Silicon Dioxide, Carbon Doped Silicon Dioxide, Porous Silicon Dioxide, Porous Carbon doped Silicon Dioxide, Spin-on organic polymeric dielectrics, Porous SiLKSpin-on silicone based polymeric dielectric, and combination thereof.

Referring now to cross-section FIG. 3, the pattern openings in the patterned photo-resist 220 have been etched into the nitride film 210 and the etching stops on the top of the electrical conductive via 130 by a conventional reactive ion etching (RIE) process to form hole 310 (preferably 500-50000 nm in size) in the first semiconductor structure 100. In one embodiment, the holes 310 can be filled to form metal vias by any metal or conductor including but not limited to W, doped-poly-silicon, and combination thereof.

Figure 4A:
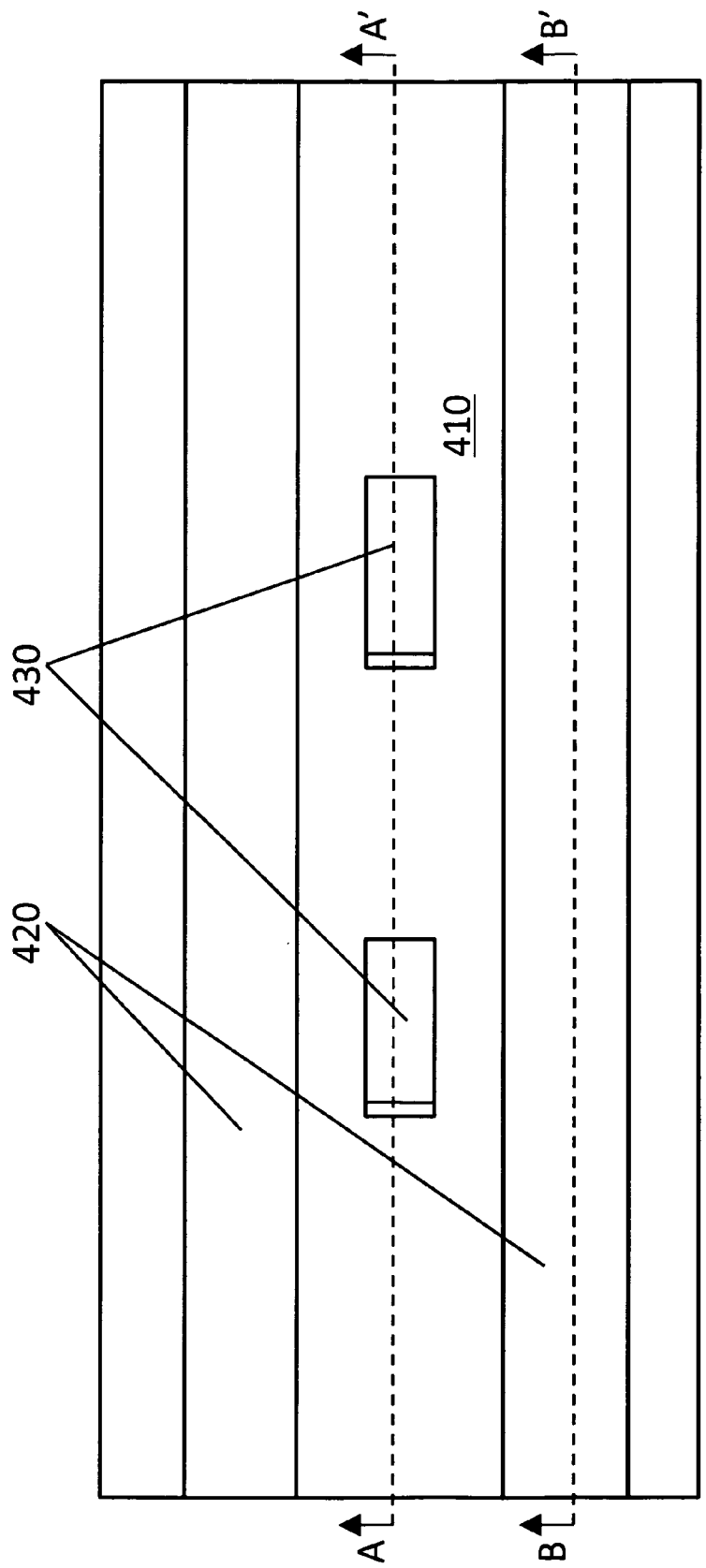
Figure 4B:
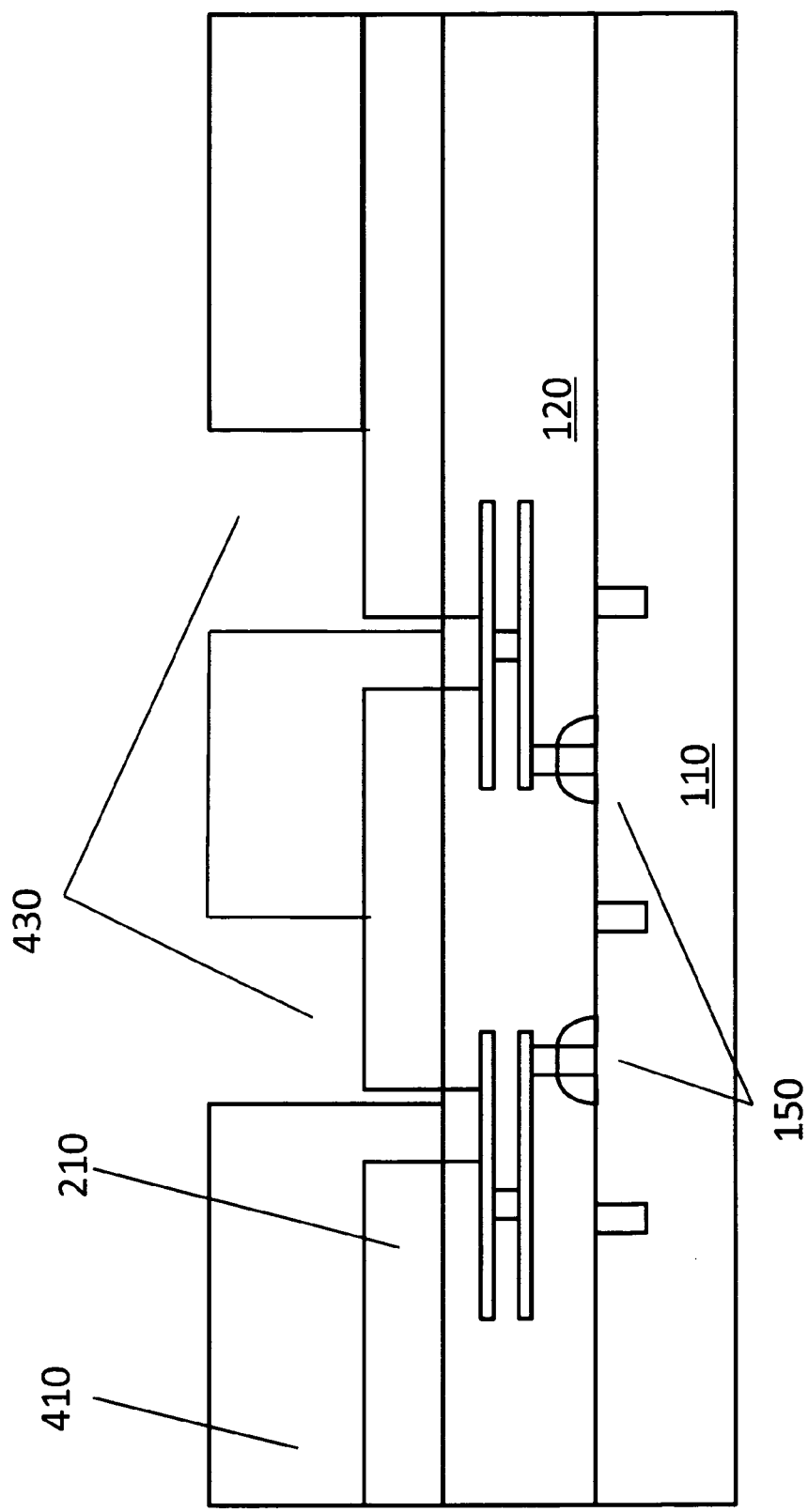
Figure 4C:
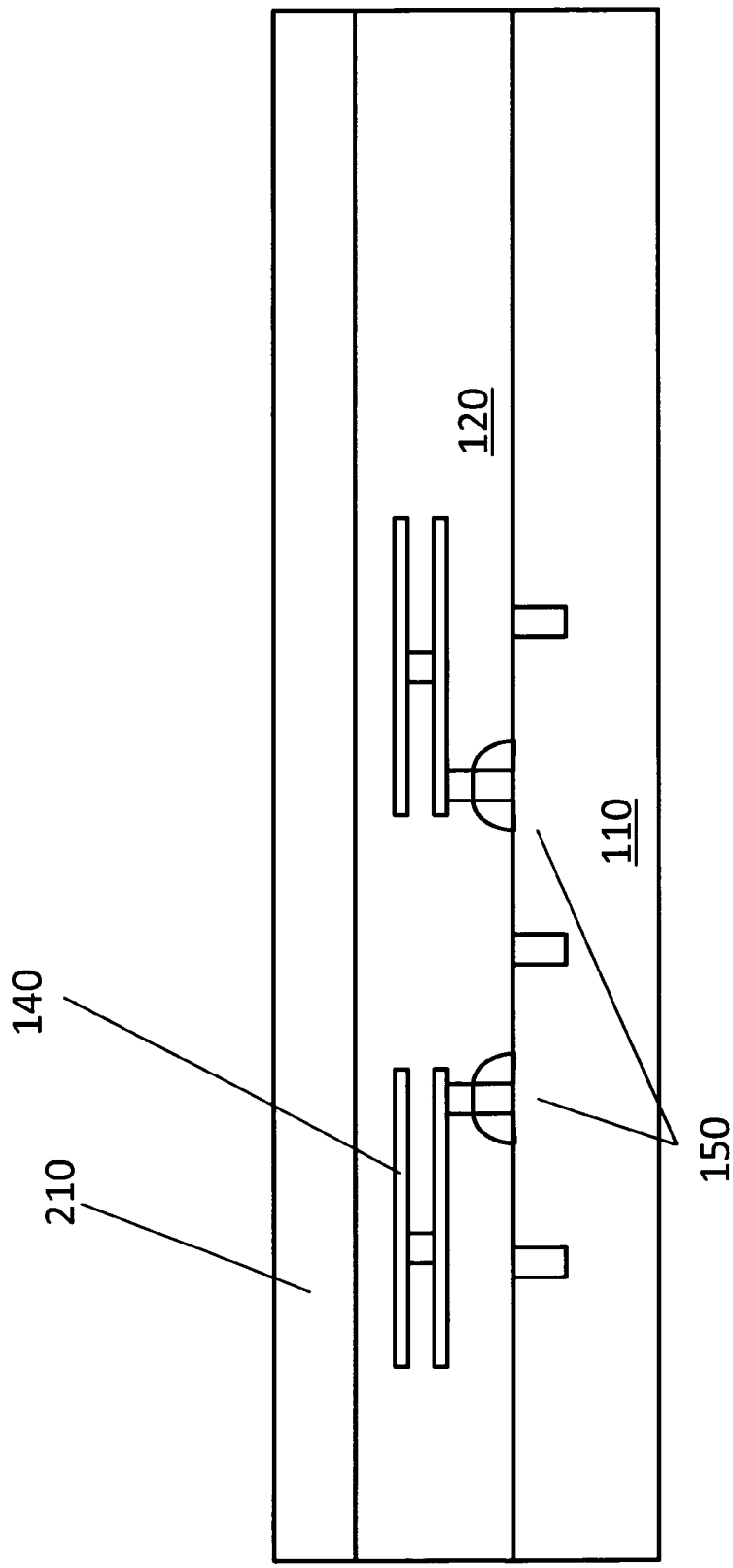

Referring now to FIGS. 4(a), 4(b), and 4(c), the patterned photo-resist 220 is removed by a conventional method of plasma ashing or wet etch, in one embodiment, the wet etch is NMP/TMAH combined with megasonics, and followed by another patterned photo-resist 410 is formed with openings 420 (preferably 500-50000 nm in width) and 430 (preferably 500-50000 nm in width and 100-100000 nm long) by a conventional lithographic method.

Figure 5A:
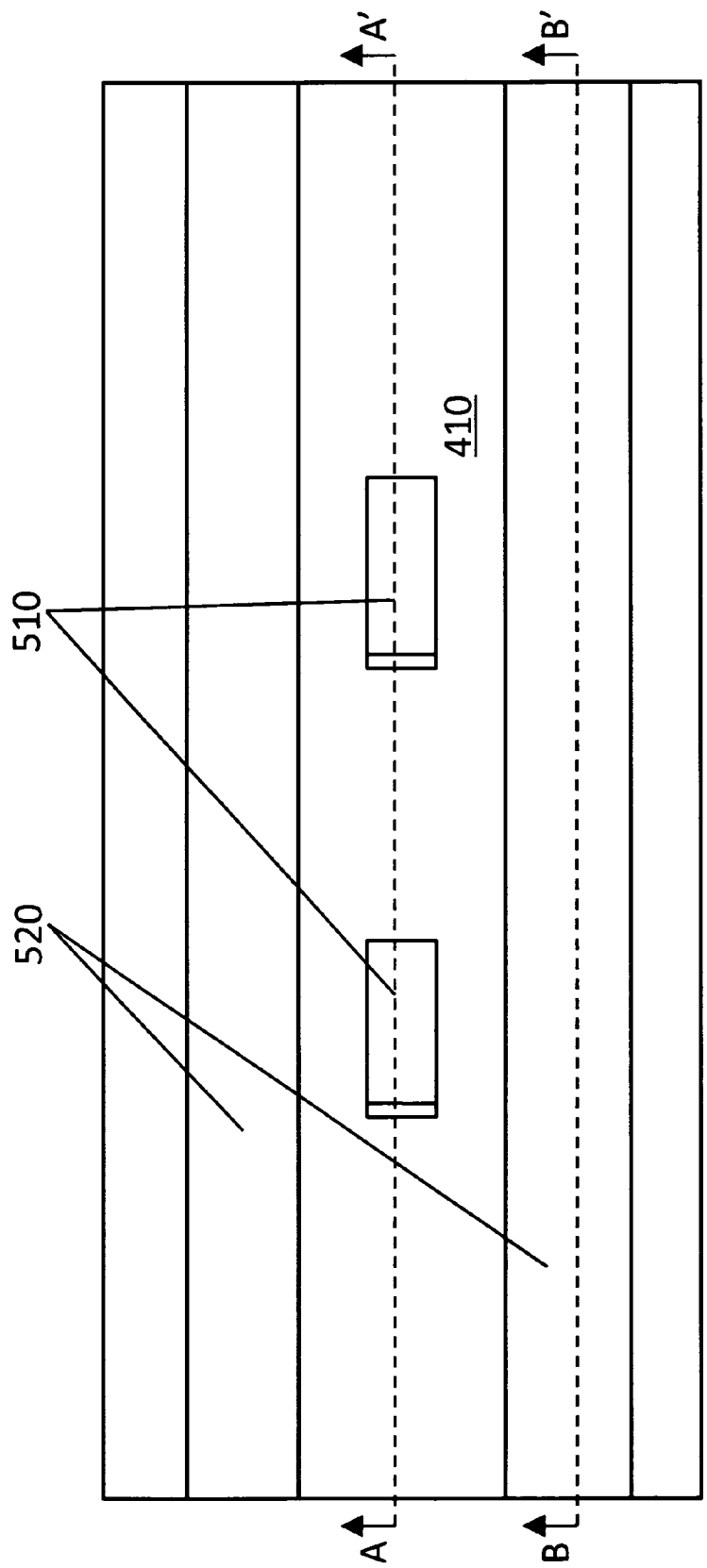
Figure 5B:
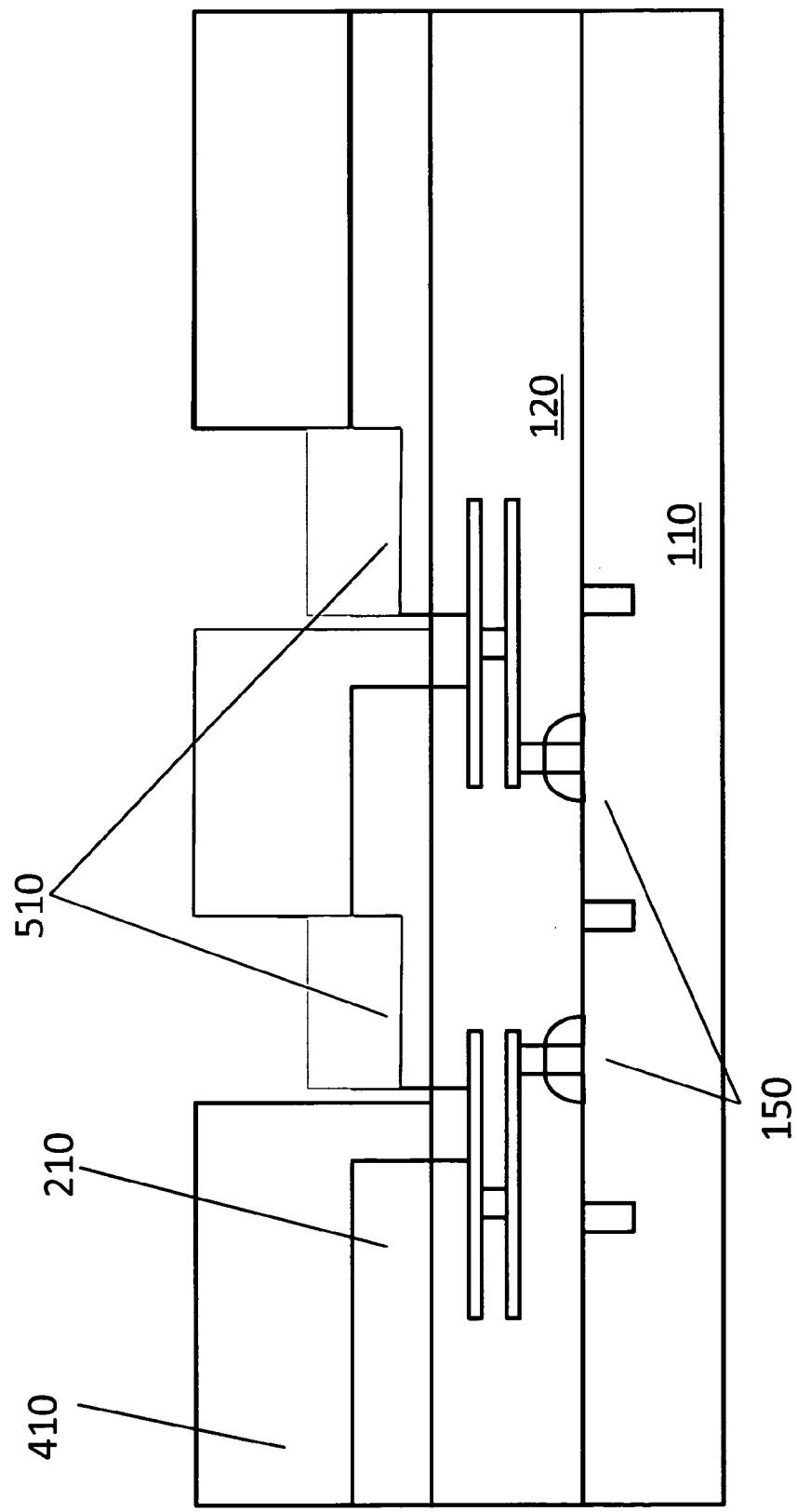
Figure 5C:
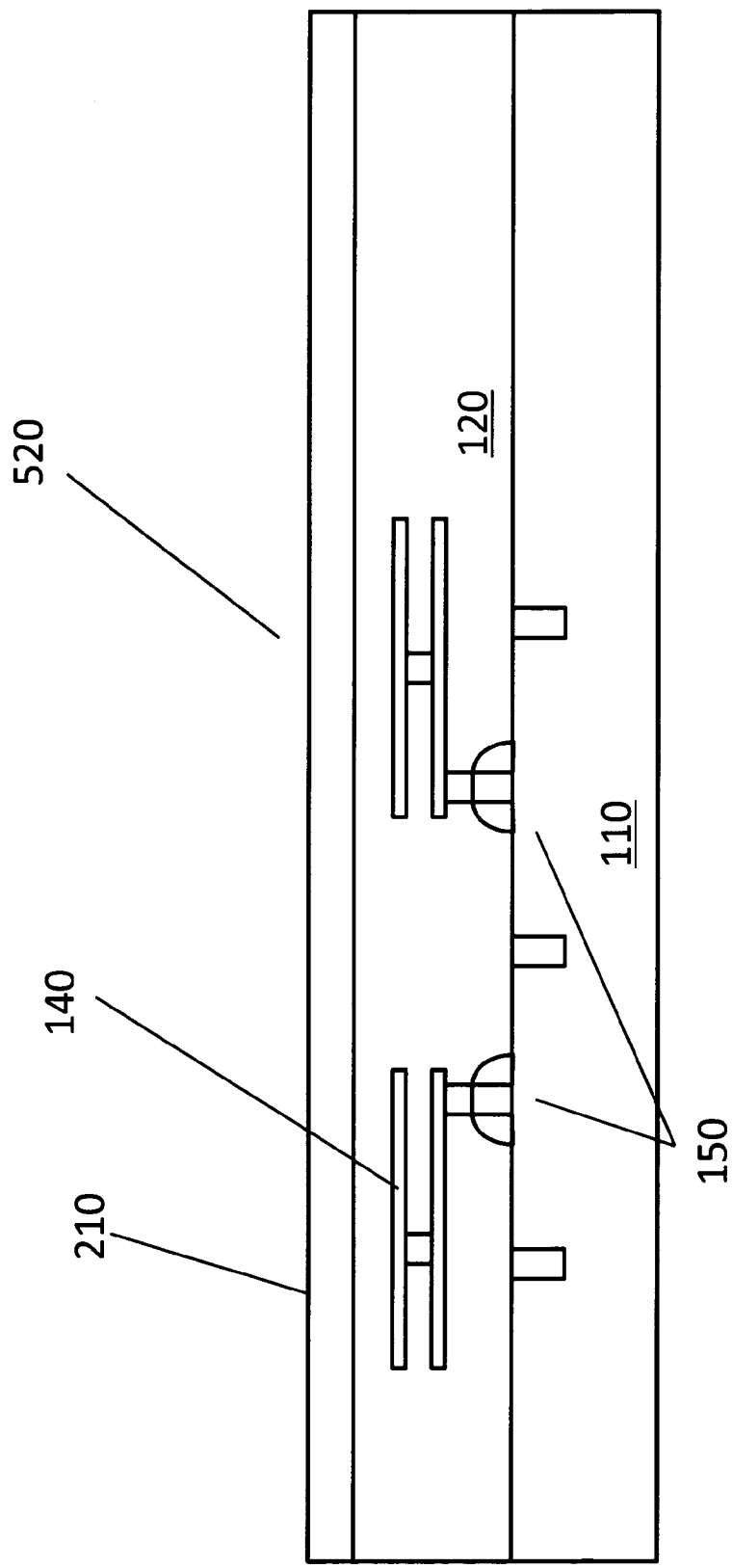

Referring now to FIGS. 5(a), 5(b), and 5(c), the pattern openings 420 and 430 in the patterned photo-resist 410 have been etched into the nitride film 210 by a conventional reactive ion etching (RIE) process to form holes 510 (preferably 500-50000 nm in width and 100-100000 nm long) and trenches 520 (preferably 500-50000 nm in width). It is noted that the holes 510 and trenches 520 preferably (preferably depth 40-40000 nm) do not extend entirely through the nitride film 210. In more detail, after the RIE, FIG. 5(a) shows the top view and FIG. 5(b) shows a cross-section cutting along A-A' shown in FIG. 5(a), and FIG. 5(c) shows a cross-section cutting along B-B' shown in FIG. 5(a). In one embodiment, conductive lines in the areas where the holes 510 and the trenches 520 are can be formed by a conventional deposition, lithography, and etching processes and the conductive lines is any electrical conductors including but not limited to Al, W, doped-poly-silicon, and combination thereof.

Figure 6A:
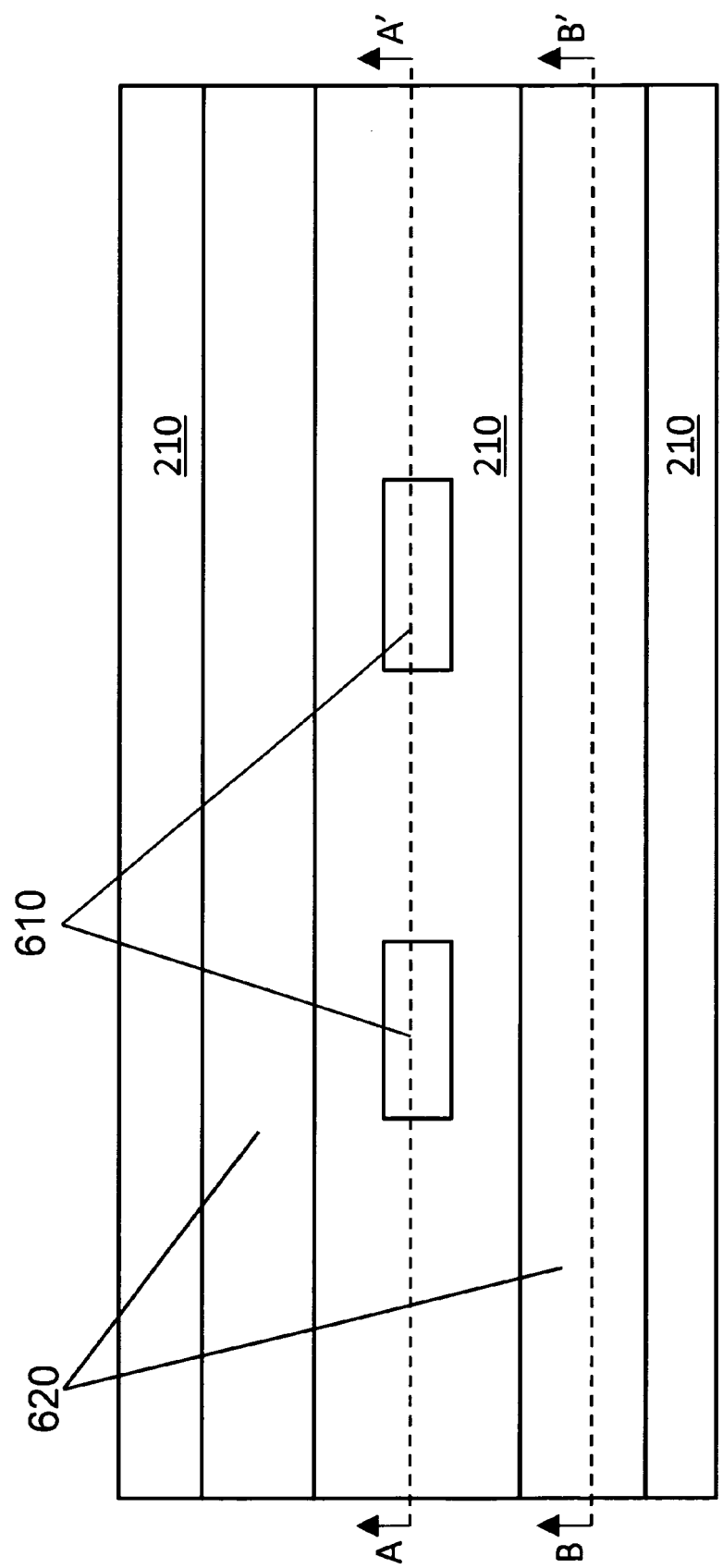
Figure 6B:
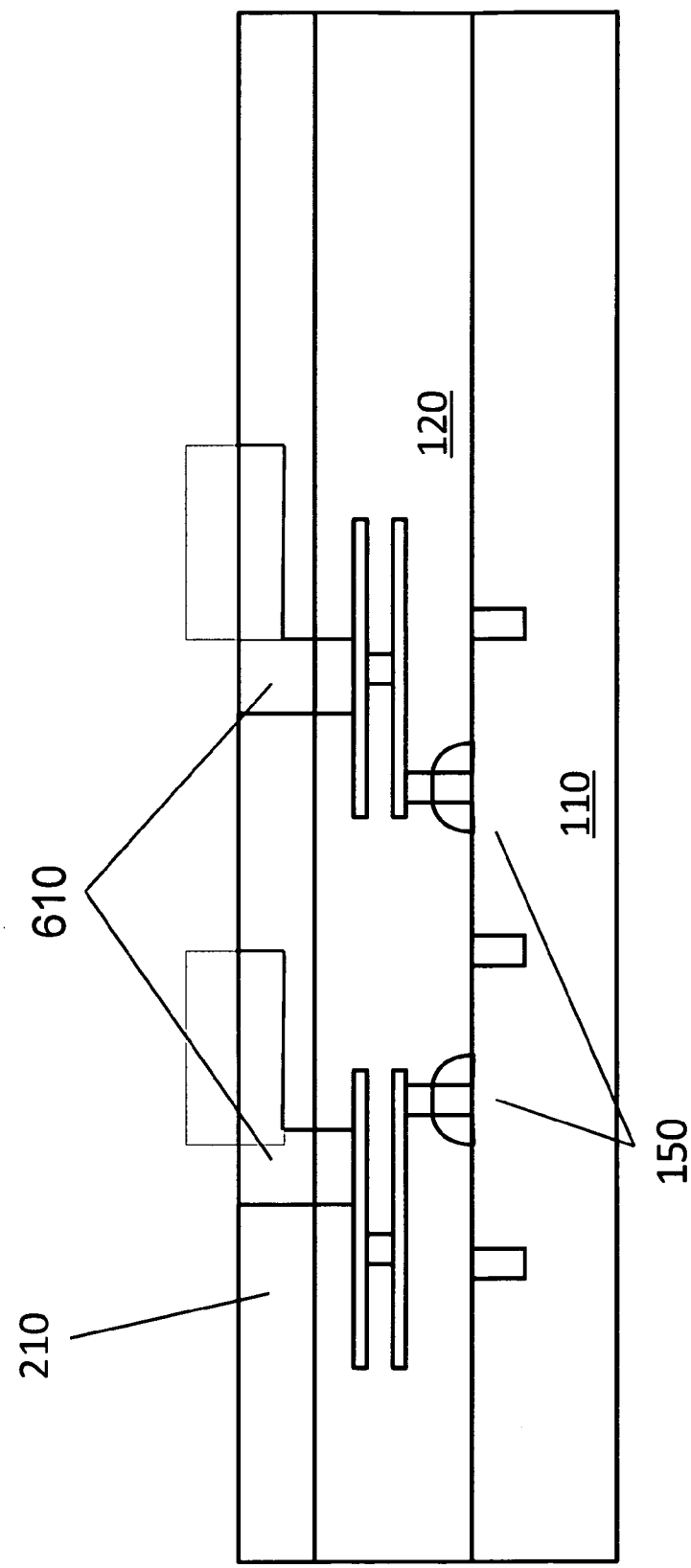
Figure 6C:
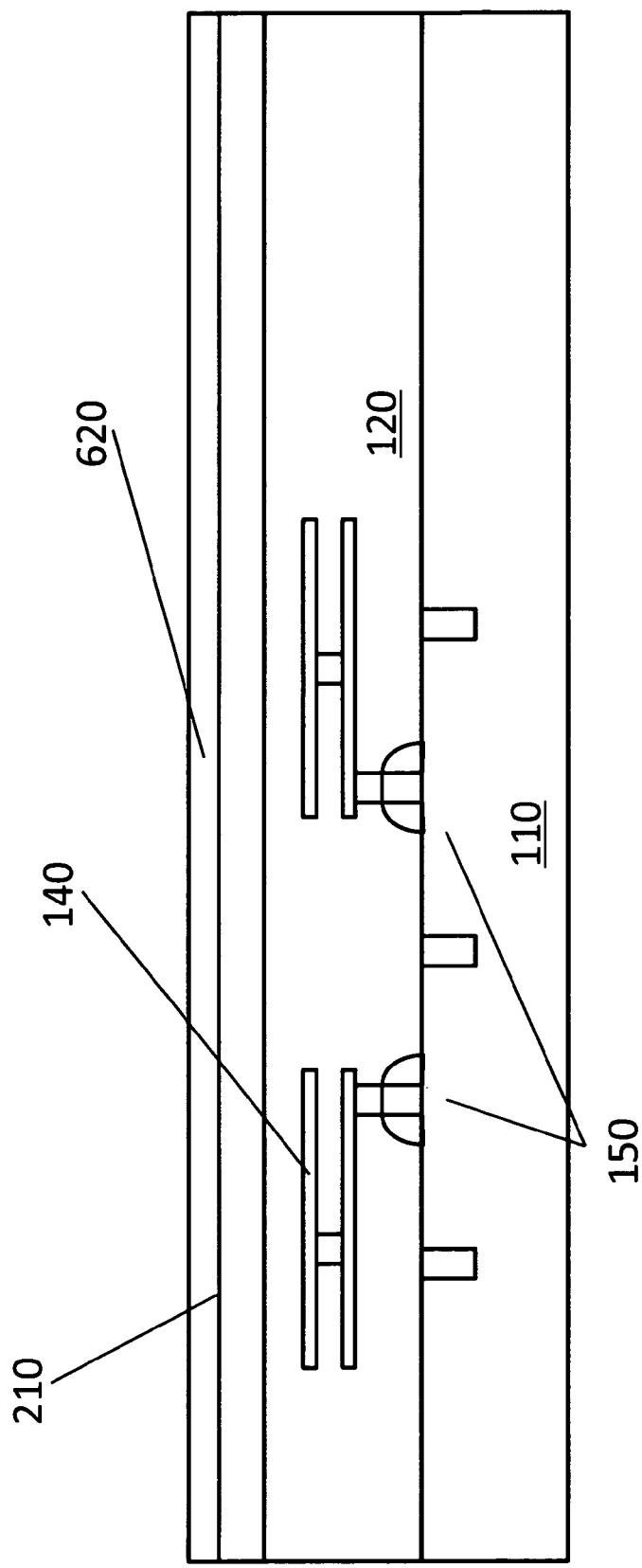

Referring now to FIGS. 6(a), 6(b), and 6(c), the patterned photo-resist 410 is removed by a conventional method of plasma ashing or wet etch, in one embodiment, the wet etch is NMP/TMAH combined with megasonics, and followed by forming dual-damascene Cu interconnect 610 and Cu interconnect 620 with conventional Cu plating process: depositing TaN/Ta barrier layer (not shown), depositing Cu seed-conduction layer, Cu electrically plating to fill. Cu, and CMP Cu stopping on the top of the nitride 210. In more detail, after the Cu dual-damascene process, FIG. 6(a) shows the top view and FIG. 6(b) shows a cross-section cutting along A-A' shown in FIG. 6(a), and FIG. 6(c) shows a cross-section cutting along B-B' shown in FIG. 6(a).

Figure 7A:
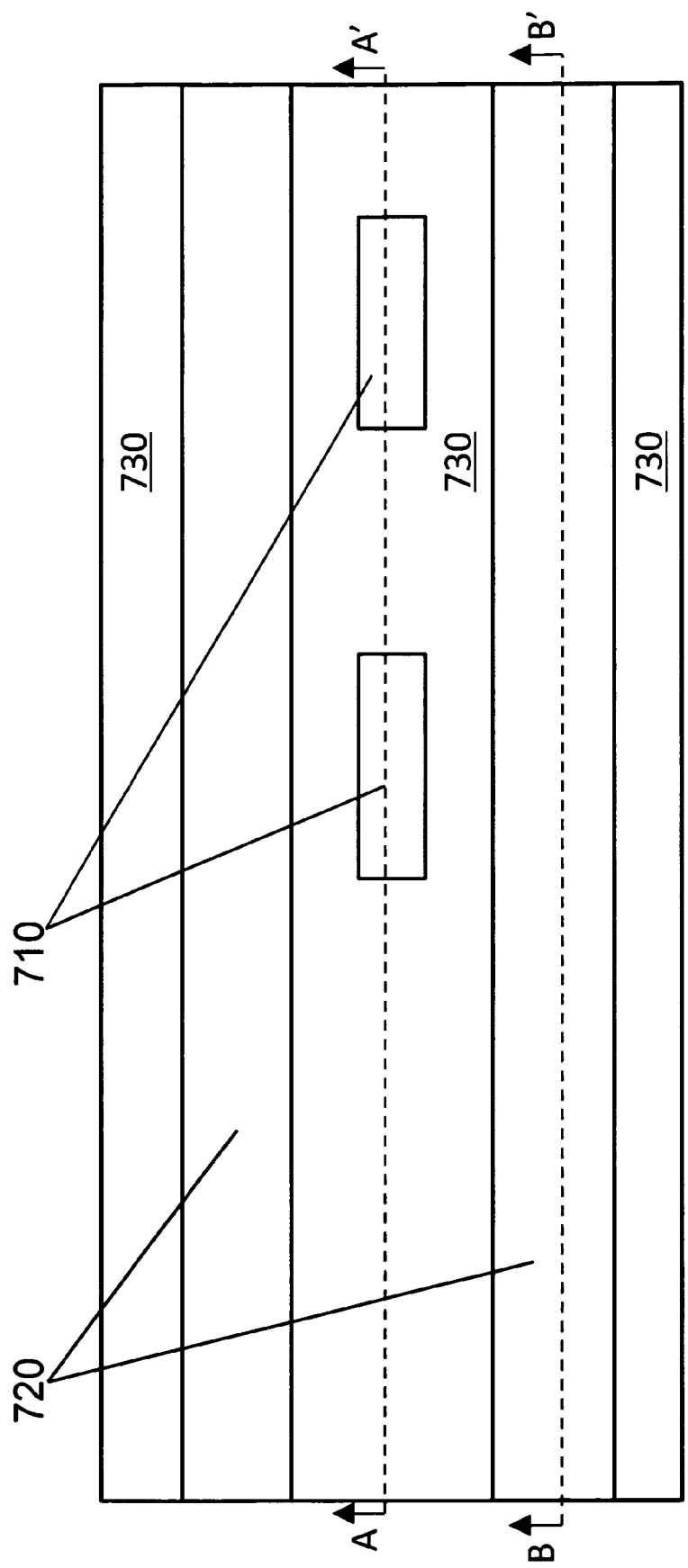
Figure 7B:
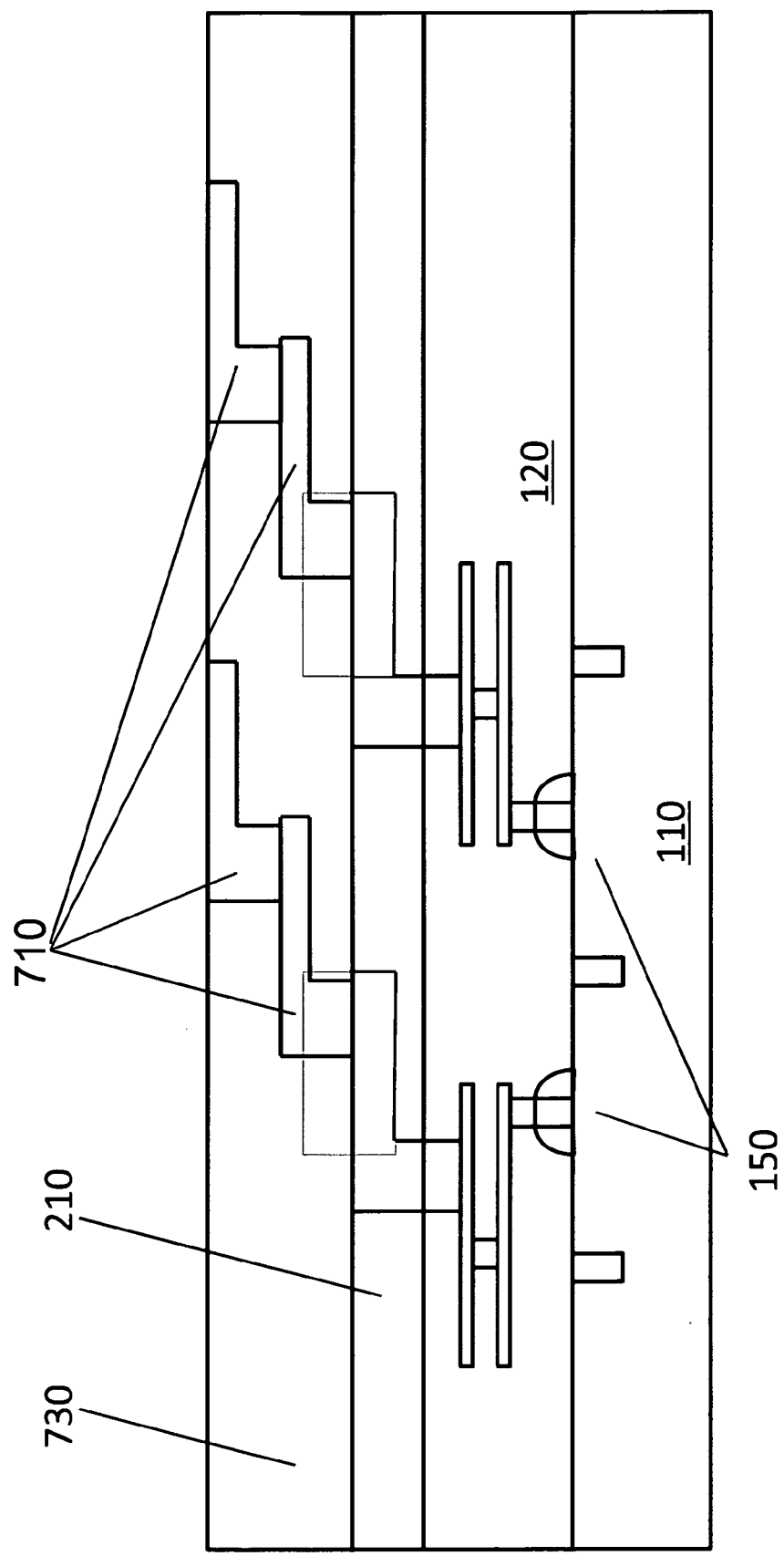
Figure 7C:
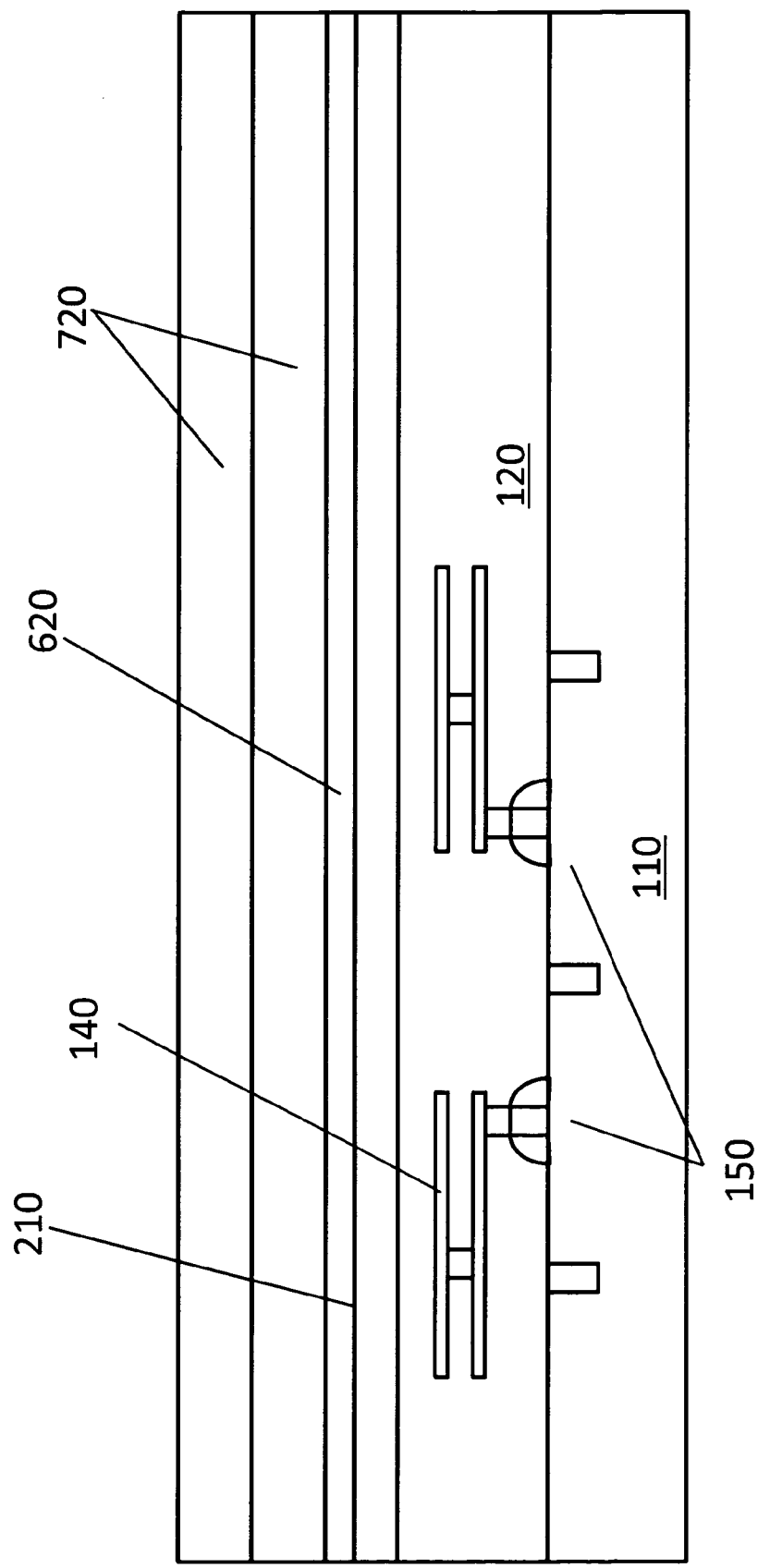

The steps shown in FIGS. 2-6 can be repeated to build another one level or multiple levels of Cu interconnect. In one embodiment, there are two additional Cu interconnects 710 and 720 are build in FIGS. 7(a), 7(b), and 7(c), and an inter layer dielectric (ILD) 730 is SiO2 instead of using nitride. In more detail, after the formation of the two additional Cu interconnects 710 and 720, FIG. 7(a) shows the top view and FIG. 7(b) shows a cross-section cutting along A-A' shown in FIG. 7(a), and FIG. 7(c) shows a cross-section cutting along B-B' shown in FIG. 7(a). In one embodiment, the ILD 730 can be replaced any insulative material including but not limited to Si3N3, Fluorine Doped Silicon Dioxide, Carbon Doped Silicon Dioxide, Porous Silicon Dioxide, Porous Carbon doped Silicon Dioxide, Spin-on organic polymeric dielectrics, Porous SiLKSpin-on silicone based polymeric dielectric, and combination thereof.

Figure 8A:
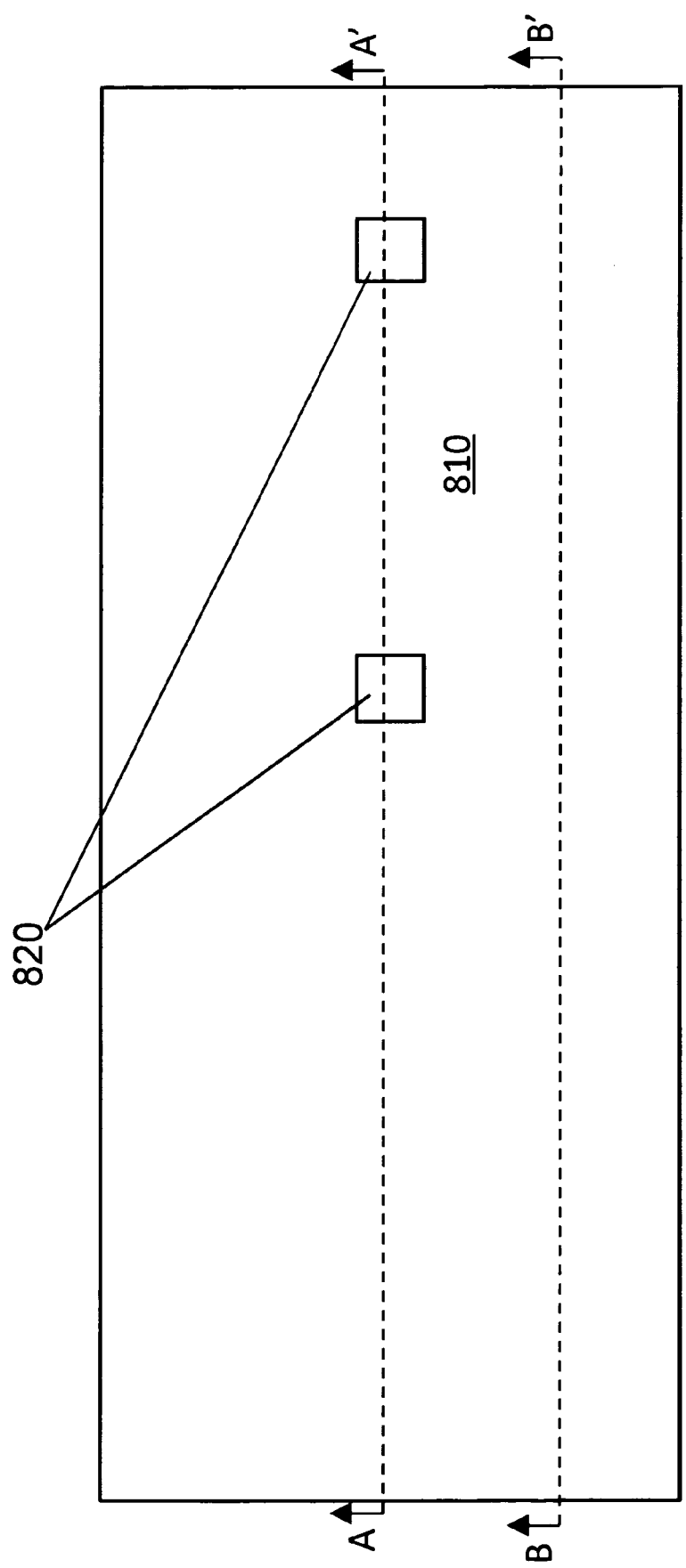
Figure 8B:
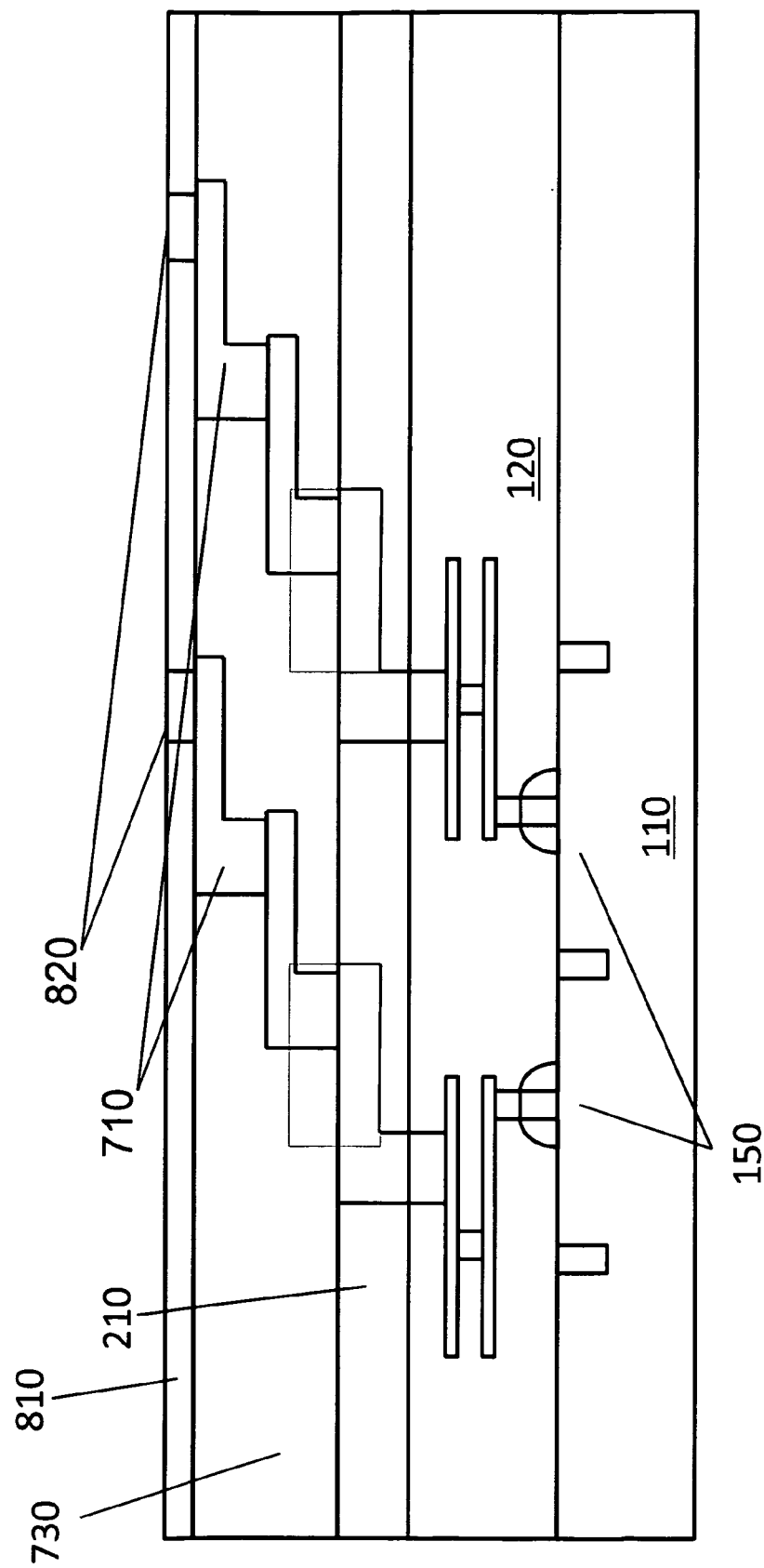

Referring now to FIGS. 8(a) and 8(b), Cu vias 820 are formed by a conventional process steps: depositing oxide 810 (preferably 10-10000 nm), patterning photo-resist for via hole opening, RIE into the oxide 810 with the photo-resist, removing the photo-resist with ashing or wet etching, depositing TaN/Ta for Cu barrier layer (not shown), conducting Cu electrical plating, and Cu CMP stopping on oxide 810. In more detail, after the Cu vias 820 (preferably 500-50000 nm in size) formation, FIG. 8(a) shows the top view and FIG. 8(b) shows a cross-section cutting along A-A' shown in FIG. 8(a).

In one embodiment, the Cu vias 820 can be replaced by any conductive material including but not limited to W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, CrSi2, Ge, Mo, MoSi2, Pd, PdSi2, Pt, PtSi, TaSi2, Ti—Pt, Ti—W, TiSi2, W, WSi2, ZrSi2 and a combination thereof.

Figure 9A:
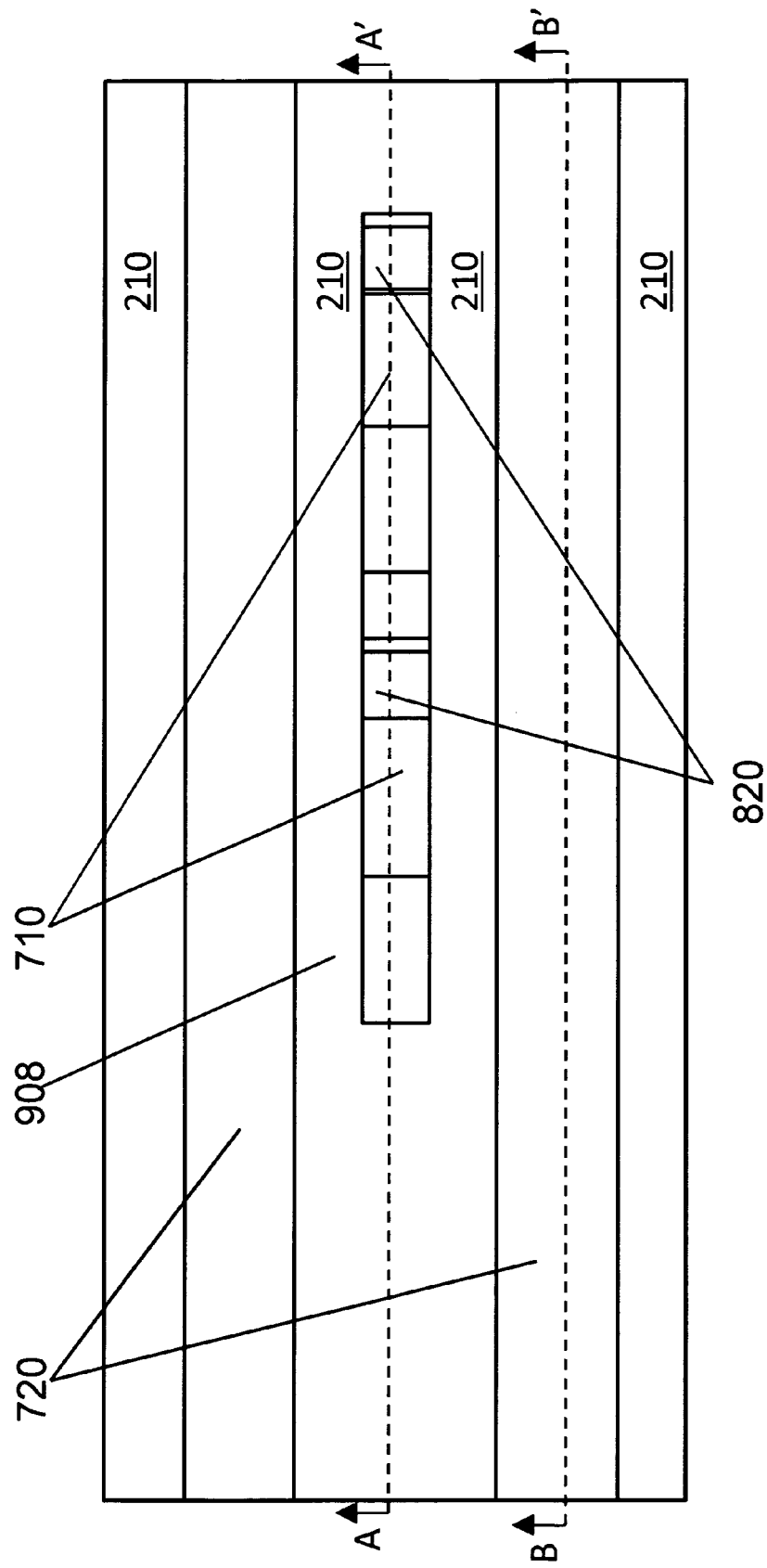
Figure 9B:
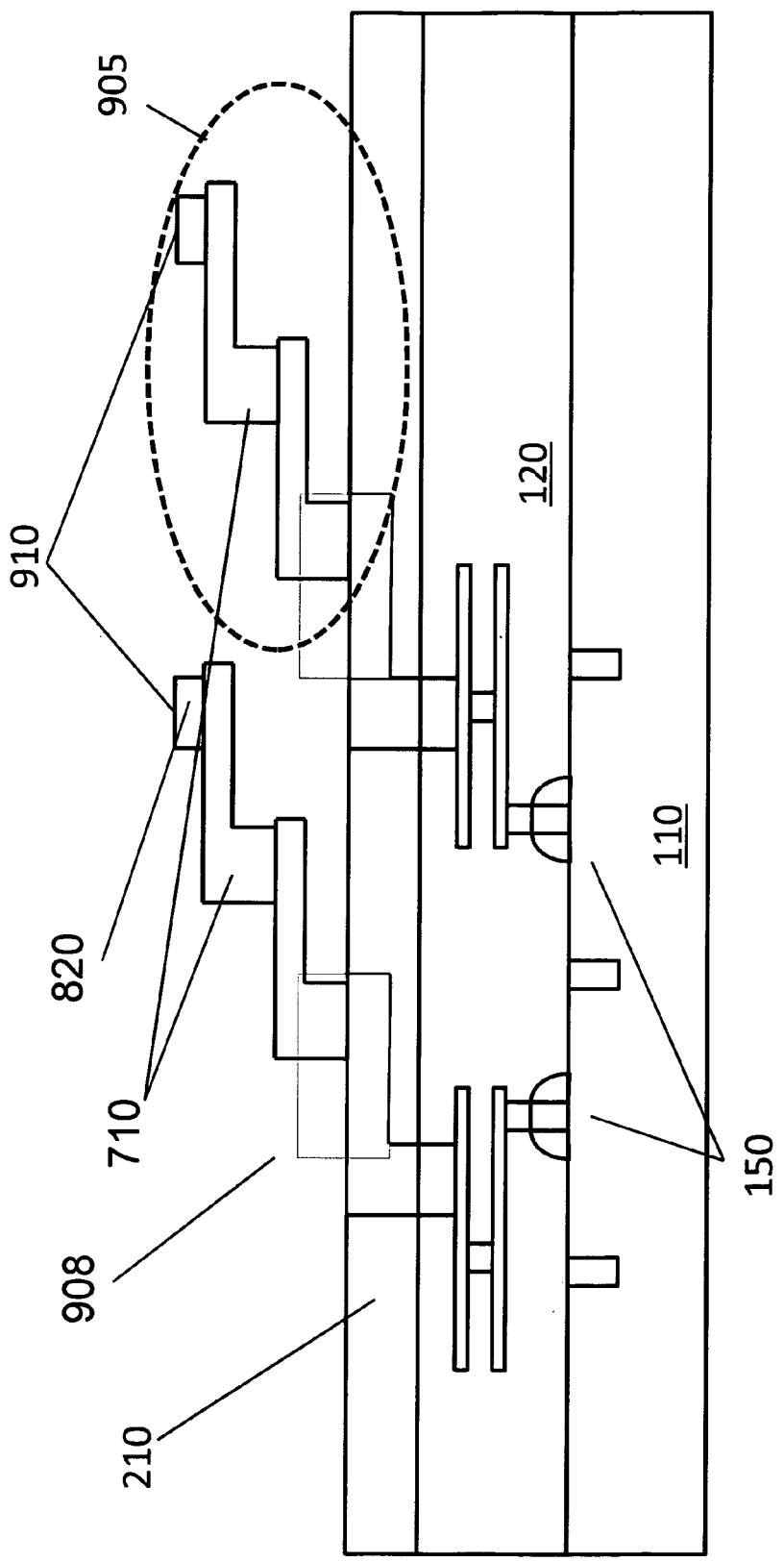
Figure 9C:
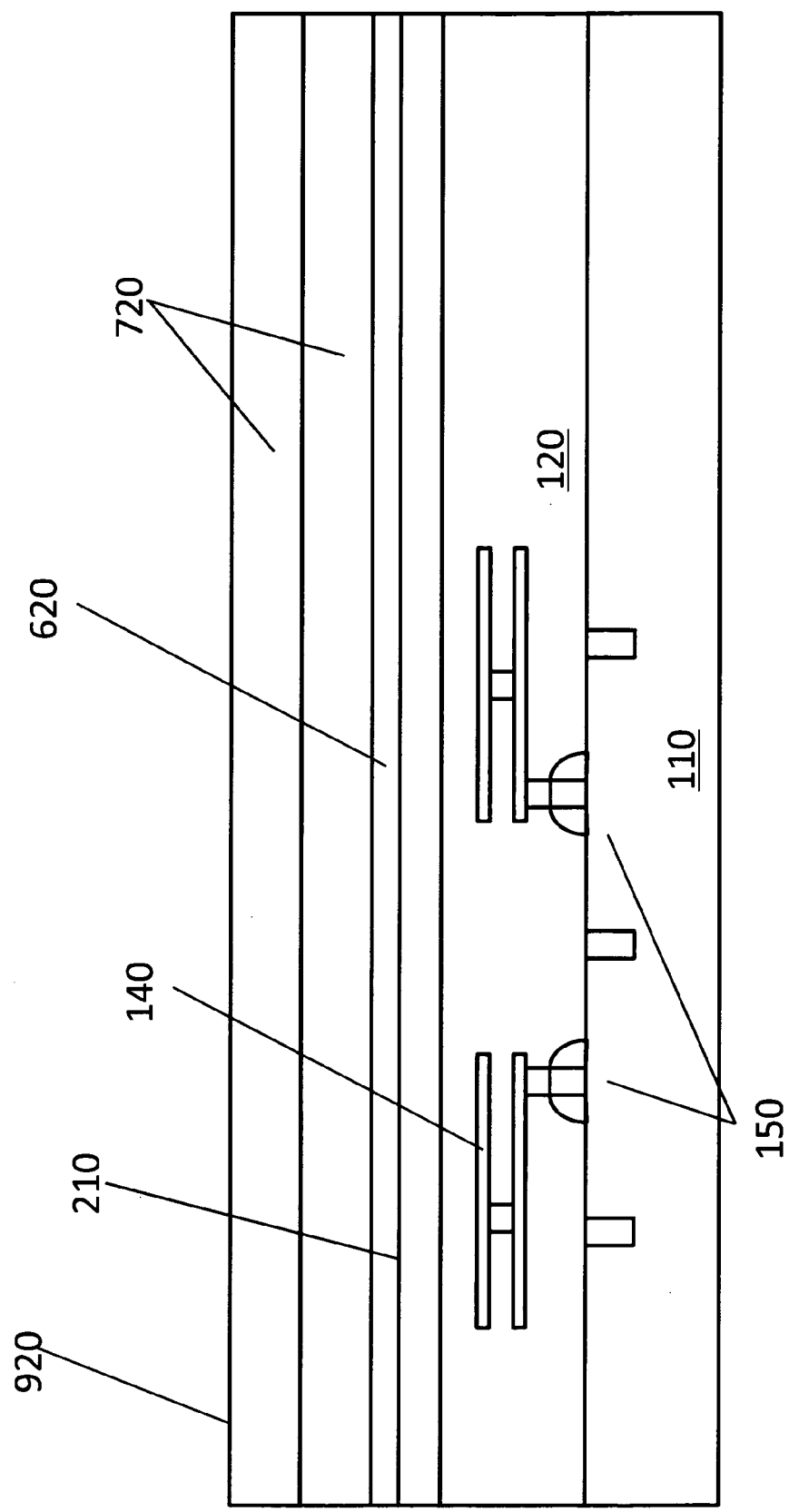

Referring to now FIGS. 9(a), 9(b), and 9(c), free-standing self-adaptive contact structures (SACSs) 905 and voids 908 are formed by etching oxide 730 and 810 selective to Cu and nitride with conventional etching processes (C4F8-CO—Ar—O2 chemistry or wet etchant including a sulfonic acid, a phosphonic acid, a phosphinic acid or a mixture of any two or more thereof, and a fluoride). In one embodiment, the etchant is HF or a dry etch of chemistry downstream etch (CDE). In more detail, after etching oxide 730 and 810, FIG. 9(a) shows the top view and FIG. 9(b) shows a cross-section cutting along A-A' shown in FIG. 9(a), and FIG. 9(c) shows a cross-section cutting along B-B' shown in FIG. 9(a). It is noted that the SACSs 905 has a zigzag shape which is flexible for a deformation when the top surfaces 910 of the Cu vias 820 are pressed down. It is also noted that the top surfaces 910 of the Cu vias 820 shown in FIG. 9(b) are higher than the top surfaces 920 of Cu interconnect 720 shown in FIG. 9(c)). More strictly speaking, the top surfaces 910 protrude out from the top surfaces 920, which is important for improving electrical connectivity and reliability of the contacts forming by a wafer-to-wafer or chip-to-wafer or chip-to-chip bonding process shown in the next 3 figures. In one embodiment, the voids 908 around the SACSs 905 can be refilled by polyimide (preferably PIQ Coupler-3) or adhesive (preferably benzocyclobutene (BCB)) with a conventional spin-on method. After the spin-on process, the polyimide (preferably PIQ Coupler-3) or adhesive (preferably benzocyclobutene (BCB)) is etched back till the top surfaces 910 and 920 are exposed. In another embodiment, a protection or barrier layer can be formed on SACSs 905 and Cu interconnect 720 by depositing a layer of SiO2 (3-50 nm) or Si3N4 (3-50 nm), spinning-on PIQ Coupler-3 or benzocyclobutene (BCB) to refill voids 908, ashing or wet etching the PIQ Coupler-3 or BCB to expose the surfaces of the SiO2 or Si3N4 on the top of Cu vias 820 and Cu interconnect 720, reactive-ion-etching (RIE) the top surfaces of the SiO2 or Si3N4 to expose the top surface of the Cu vias 820 and Cu interconnect 720.

Figure 10A:
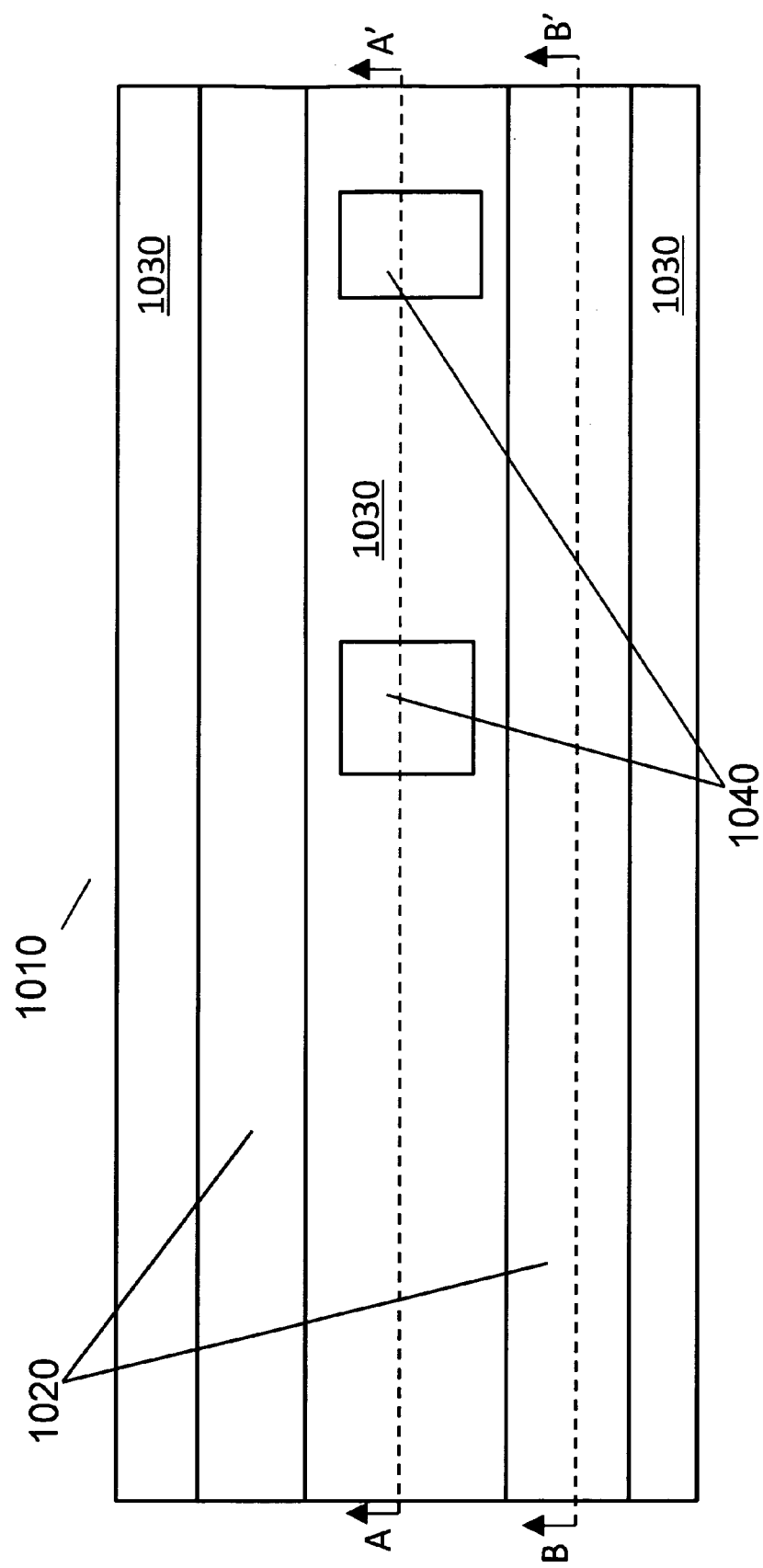
Figure 10B:
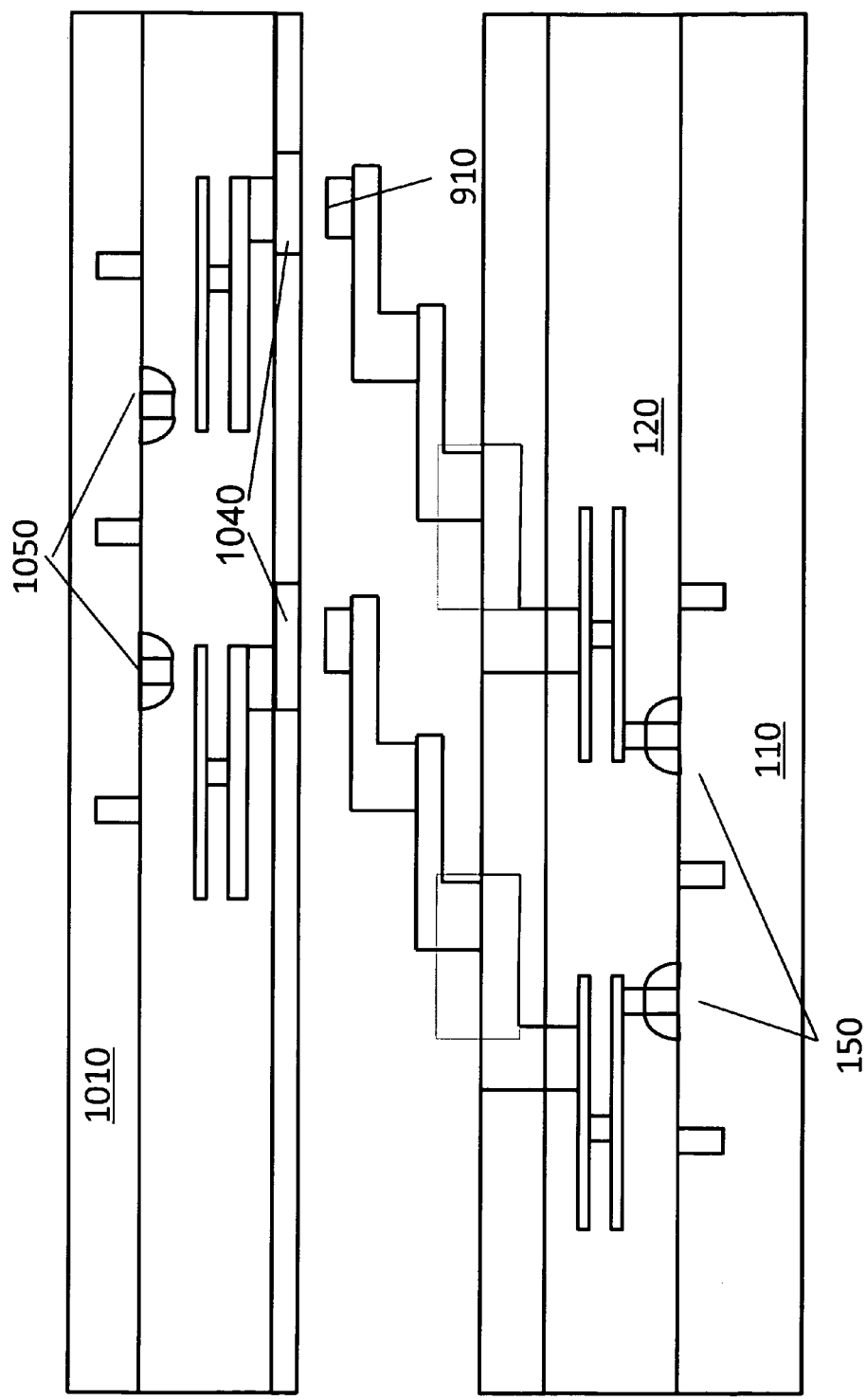
Figure 10C:
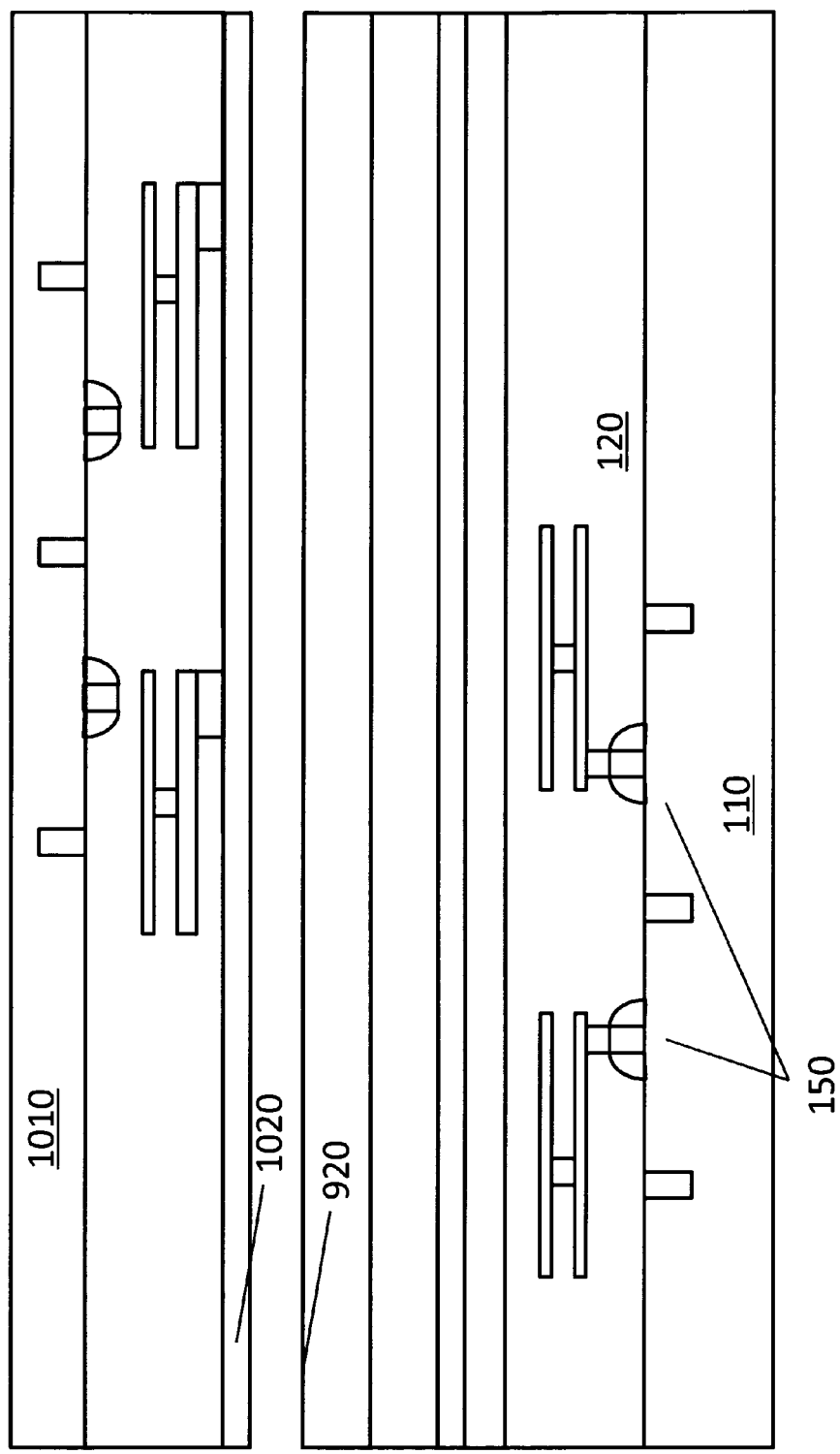

Referring to now FIGS. 10(a), 10(b), and 10(c), they show the first semiconductor structure 100 and a second semiconductor structure 1000 before they are bonded together. In more detail, FIG. 10(a) shows the top view of the second semiconductor structure 1000. FIG. 10(b) shows the combination of the cross-section (on the top) of the flipped over second semiconductor structure cutting along A-A' shown in FIG. 10(a) and the cross-section shown in FIG. 9(b) (on the bottom). Similarly, FIG. 10(c) shows the combination of the cross-section of the flipped over second semiconductor structure cutting along B-B' shown in FIG. 10(a) and the cross-section shown in FIG. 9(c). Particularly referring to FIGS. 10(a), 10(b) and 10(c) there are illustrated the second semiconductor structure 1000 having semiconductor substrate 1010, having electrical conductive interconnect 1020, having insulative dielectric 1030, having electrical conductive landing pad 1040, and electrical active devices 1050. The semiconductor substrate 1010 useful for the present invention is any semiconductor material including but not limited to group IV semiconductors such as silicon, silicon germanium, or germanium, a III-V compound semiconductor, or a II-VI compound semiconductor and combination thereof. The interconnect 1020 useful for the present invention is any electrically conductive material including but not limited to Cu, W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, CrSi2, Ge, Mo, MoSi2,Pd, PdSi2, Pt, PtSi, TaSi2, Ti—Pt, Ti—W, TiSi2, W, WSi2, ZrSi2 and combination thereof. The insulative dielectric 1030 useful for the present invention is any insulative material including but not limited to SiO2, Si3N4, Fluorine Doped Silicon Dioxide, Carbon Doped Silicon Dioxide, Porous Silicon Dioxide, Porous Carbon doped Silicon Dioxide, Spin-on organic polymeric dielectrics, Porous SiLK, Spin-on silicon based polymeric dielectric, and combination thereof. The electrical conductive landing pad 1040 useful for the present invention is any conductive material including but not limited to Cu, W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, CrSi$_2$, Ge, Mo, MoSi$_2$, Pd, PdSi$_2$, Pt, PtSi, TaSi$_2$,Ti—Pt, Ti—W, TiSi$_2$, W, WSi$_2$, ZrSi$_2$, Si3N4, silicon dioxide, fluorine doped silicon dioxide, carbon doped silicon dioxide, porous silicon dioxide, porous carbon doped silicon dioxide, porous SiLK and combination thereof. The electrically active devices 1050 useful for the present invention are any kind of devices including but not limited to MOSFEF, BJT, DRAM, flash memory, FinFET, tri-gate FET, PCM and combination thereof.

Figure 11A:
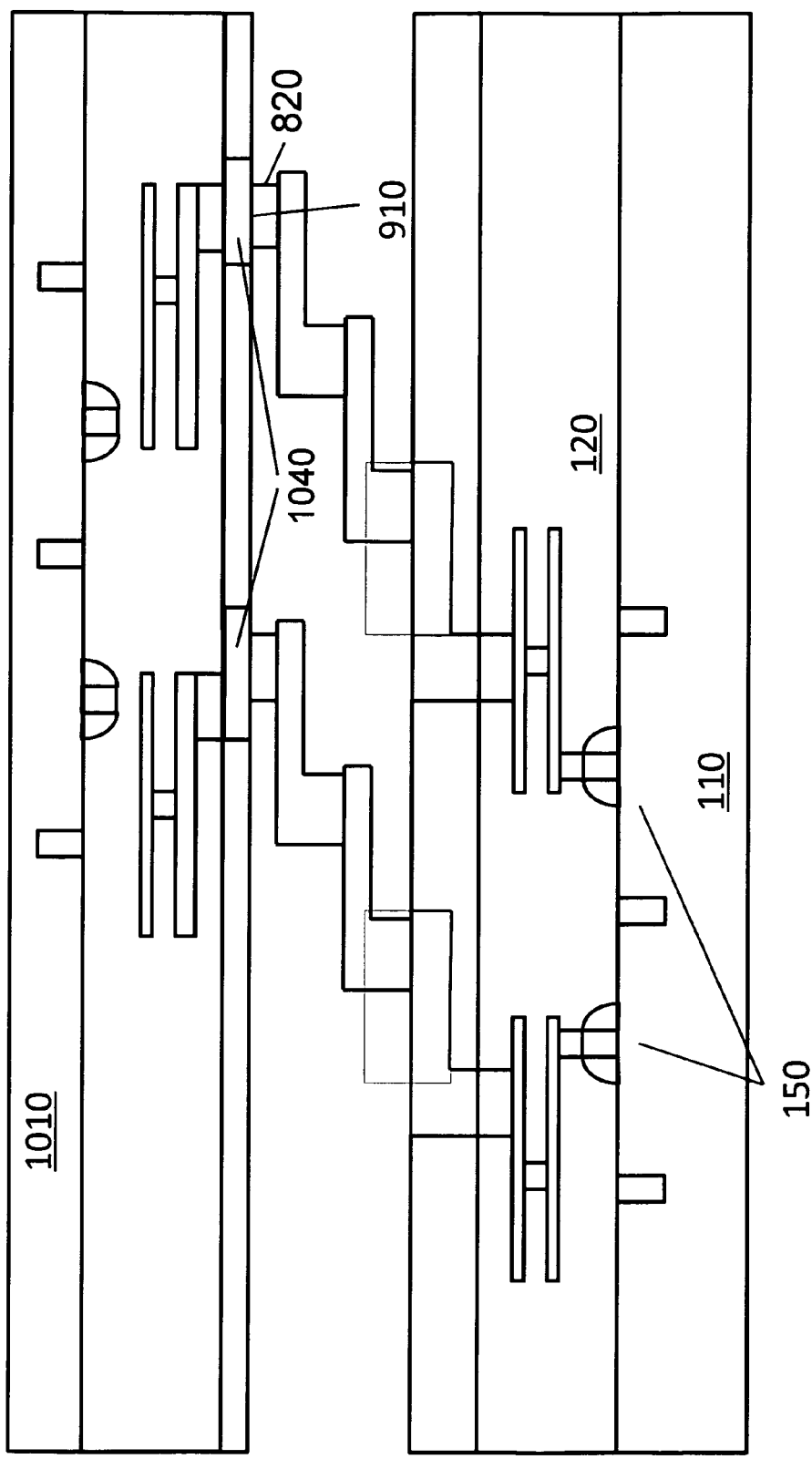
Figure 11B:
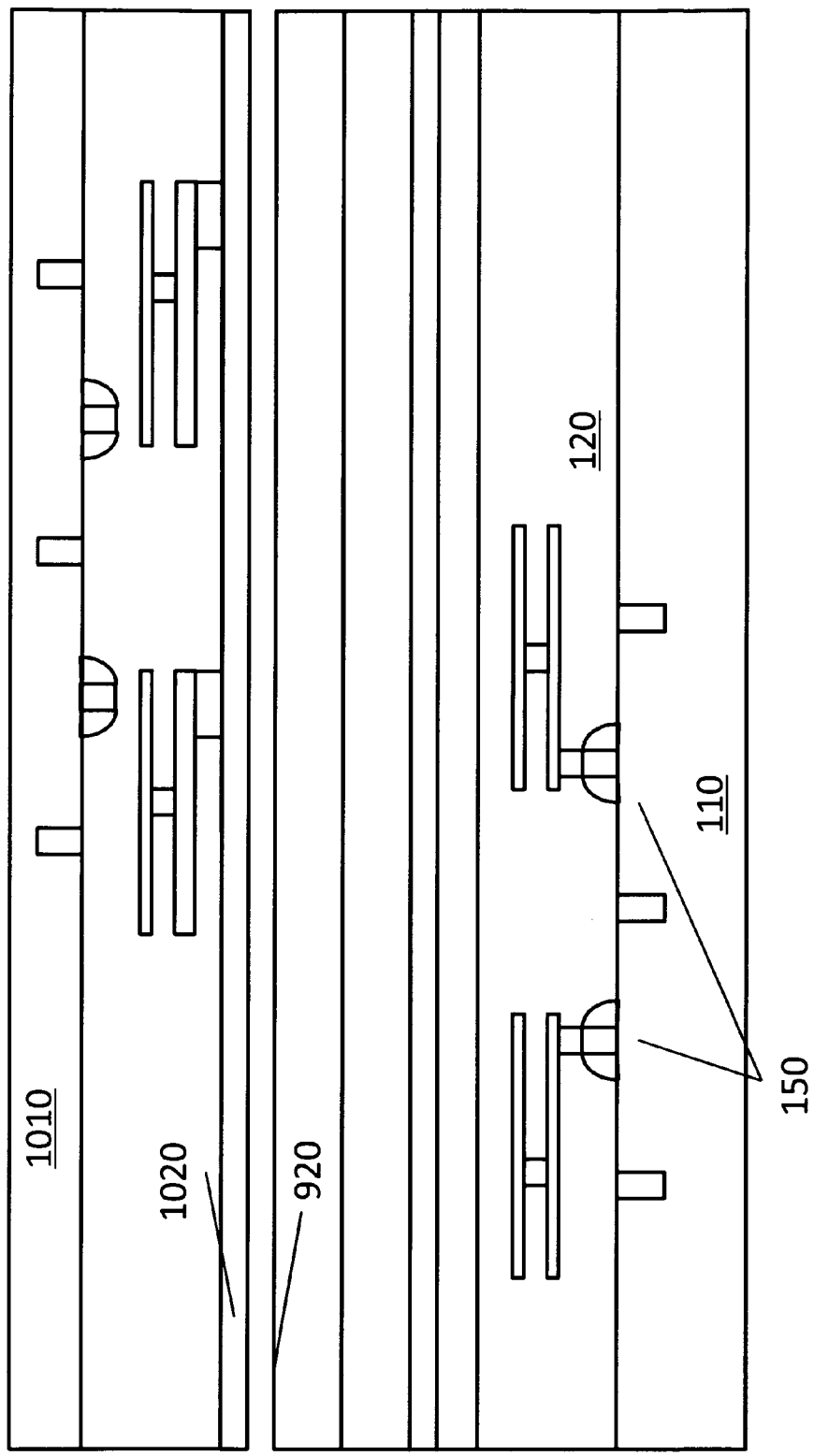

Referring to now FIGS. 11(a) and 11(b), they show the first step to join the first semiconductor structure 100 with the second semiconductor structure 1000. In more detail, FIG. 11(b) shows the combination of the cross-section (on the top) of the flipped over second semiconductor structure cutting along A-A' shown in FIG. 10(a) and the cross-section of the first semiconductor structure cutting along A-A' shown in FIG. 9(a) (on the bottom). Similarly, FIG. 10(c) shows the combination of the cross-section of the flipped over second semiconductor structure cutting along B-B' shown in FIG. 10(a) and the cross-section of the first semiconductor structure cutting along A-A' shown in FIG. 9(a) (on the bottom). It is noted that in this first step, as shown in FIG. 11(a), the top surfaces 910 of the Cu vias 820 of the first semiconductor structure 100 have contacted with the landing pads 1040 of the second semiconductor structure 1000, while the top surfaces 920 of Cu interconnect 720 of the first semiconductor structure 100 have not contacted with the interconnect 1020 of the second semiconductor structure 1000, as shown in FIG. 11(b). It is because that the top surfaces 910 protrude out from the top surfaces 920.

Figure 12A:
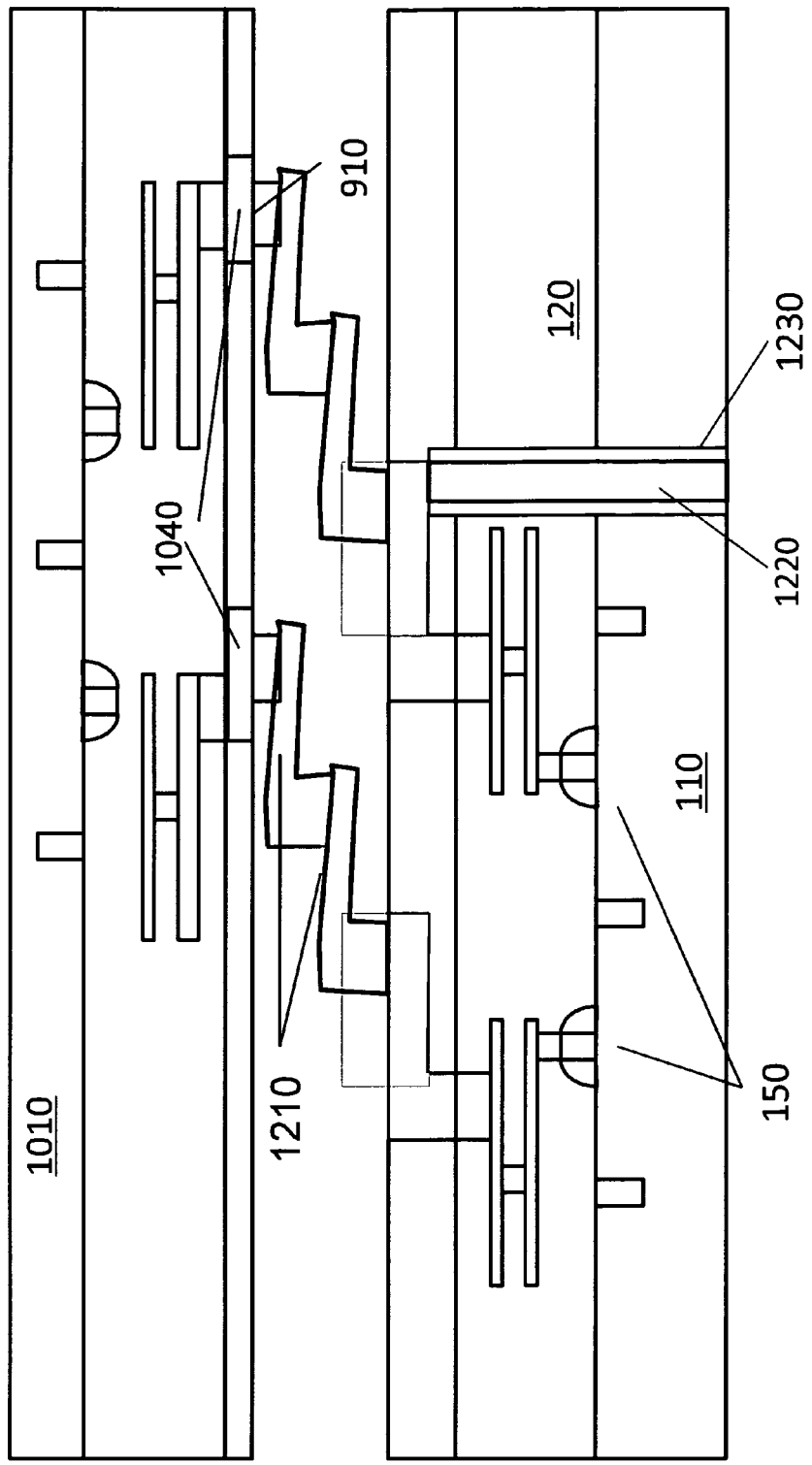
Figure 12B:
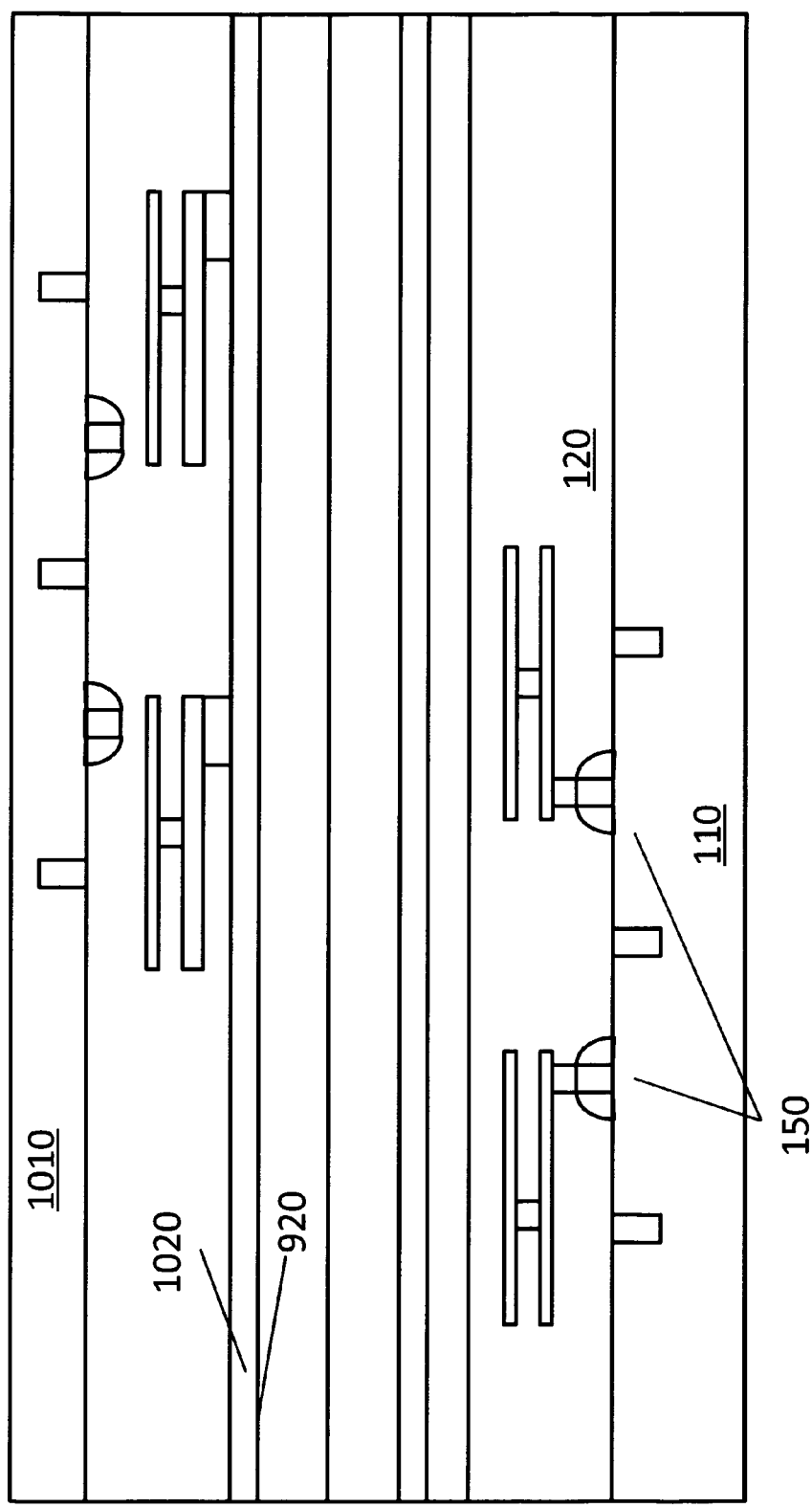

Referring to now FIGS. 12(a) and 12(b), they show the second step to join the first semiconductor structure 100 with the second semiconductor structure 1000. In more detail, FIG. 12(*b*) shows the combination of the cross-section (on the top) of the flipped over second semiconductor structure cutting along A-A' shown in FIG. 10(*a*) and the cross-section of the first semiconductor structure cutting along A-A' shown in FIG. 9(*a*) (on the bottom). Similarly, FIG. 10(*c*) shows the combination of the cross-section of the flipped over second semiconductor structure cutting along B-B' shown in FIG. 10(*a*) and the cross-section of the first semiconductor structure cutting along A-A' shown in FIG. 9(*a*) (on the bottom). In the second step, the first semiconductor structure 100 and the second semiconductor structure 1000 are further pressed together, as shown in FIG. 12(*b*), to form contact between the top surfaces 920 of Cu interconnect 720 of the first semiconductor structure 100 and the interconnect 1020 of the second semiconductor structure 1000. In the meantime, shown in FIG. 12(*a*), the top surfaces 910 of the Cu vias 820 of the first semiconductor structure 100 have moved down self-adaptively when the landing pads 1040 of the second semiconductor structure 1000 are pressed down and the Cu interconnects 710 have being bended down to form bended Cu interconnects 1210. If there is a void or open between the landing pad of the second wafer and the top surface of one, say SACS_v1, of the SACSs 905, the amount of moving down of SACS_v1 top surface is smaller and then the void or open is eliminated, which improves 3D IC yields, electrical connectivity and reliability. Preferably, bonding temperature is about 20-550 degrees Centigrade and bonding contact force is about 0.1-60 kN and bonding time is about 5 minus-10 hours. In this case, if there are some opens or voids between the top surfaces 910 and the landing pads 1040 due to non-uniformity of both the exposed surfaces of the landing pads 1040 and the top surfaces 910, this second step can reduce the probability of the opens by eliminating at least some of the voids and then improve electrical connectivity and contact reliability between the Cu interconnects 710 and the landing pads 1040. In one embodiment, if the voids 908 around the SACSs 905 filled by polyimide (preferably PIQ Coupler-3) or adhesive (preferably benzocyclobutene (BCB)), it is preferably to bond the first semiconductor structure 100 and the second semiconductor structure 1000 at a temperature that the young modulus of the polyimide or adhesive is less than 0.4 GPa. In one embodiment, at least one through-semiconductor-via 1220 and insulative sidewall 1230 are formed in the first semiconductor structure 100 with conventional process steps. The through-semiconductor-via 1220 extends through the substrate of the first semiconductor structure 100 and electrically connects to an interconnect or a device layer in the first semiconductor structure 100. In another embodiment, at least one through-semiconductor-via (not show) is formed in the second semiconductor structure 1000 with conventional process steps and extends through the substrate of the second semiconductor structure 1000 to electrically connect to a interconnect or a device layer in the second semiconductor structure 1000.

In another embodiment, before a bonding process, a structure can be made with a conventional process that there are not the Cu vias 820 (shown in FIG. 10(*b*)) instead of the surfaces of the landing pad 1040 protruding out from the top surface of the second semiconductor structure 1000. The rest of process steps are the same as shown in FIGS. 11 and 12.

Figure 13:
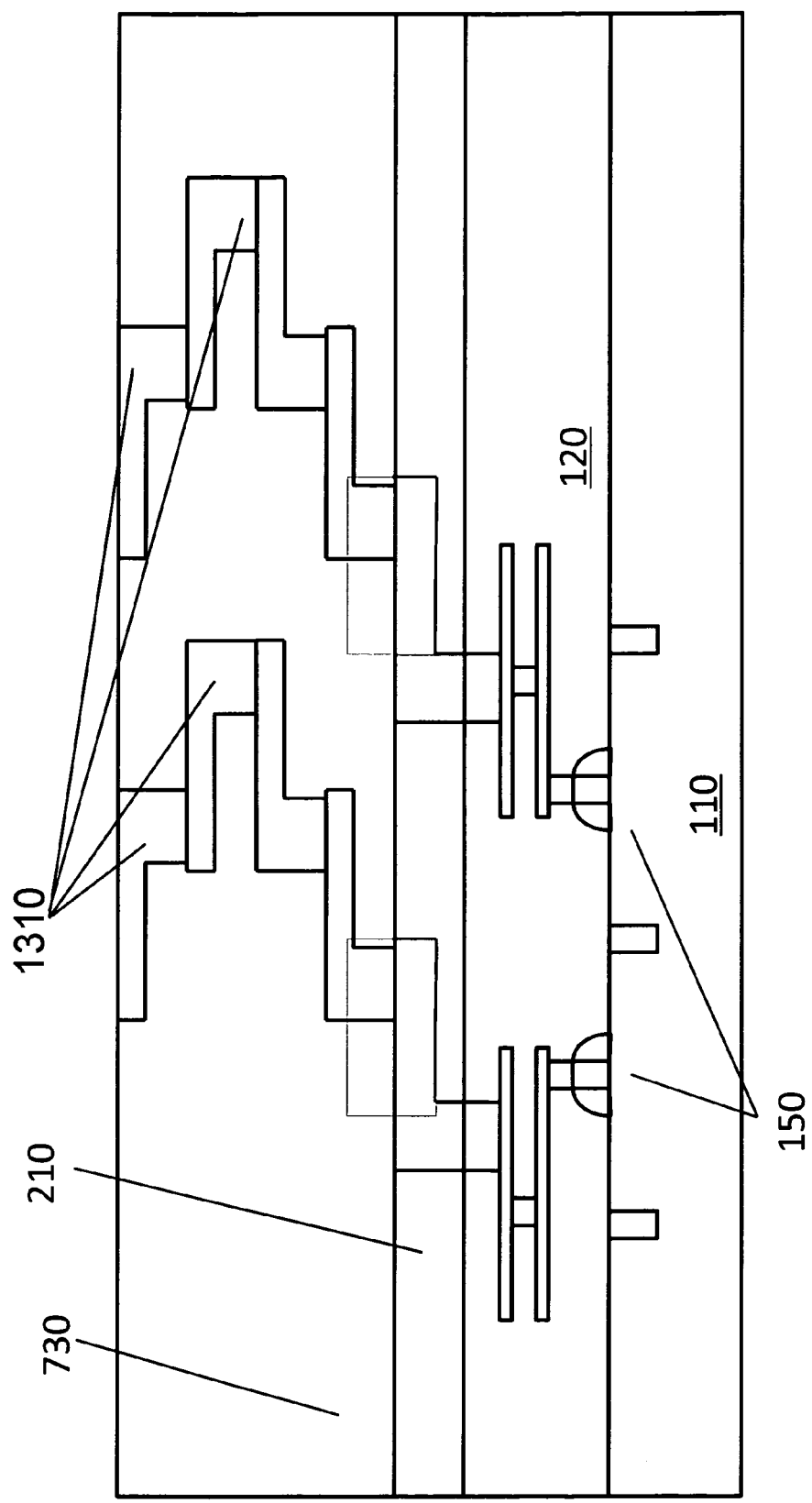

Referring to now FIG. 13, it shows a cross-sectional view that, after the step shown in FIGS. 7(*a*), 7(*b*) and 7(*c*), additional two levels of Cu interconnect are built in the oppose direction shown in FIG. 7(*b*) by repeating the same steps in FIGS. 2-6.

Figure 14:
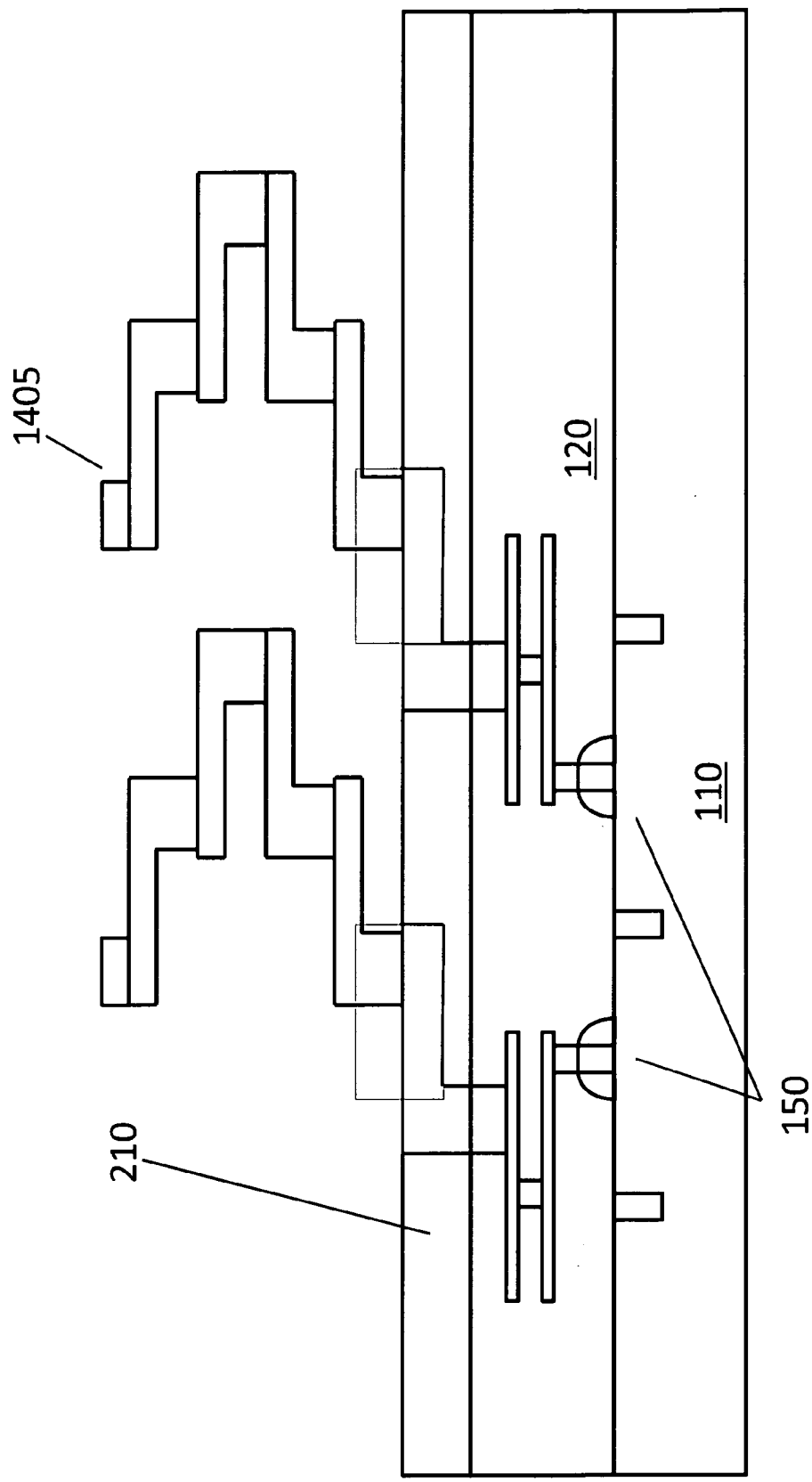

Referring to now FIG. 14, it shows that free-standing self-adaptive contact structures (SACSs) 1405 are formed by repeating the steps shown in FIGS. 8(*a*), 8(*b*), 9(*a*), 9(*b*), and 9(*c*). It is noted that the top ends of the free-standing SACSs 1405 are at least approximately aligned to their bottom ends.

Figure 15:
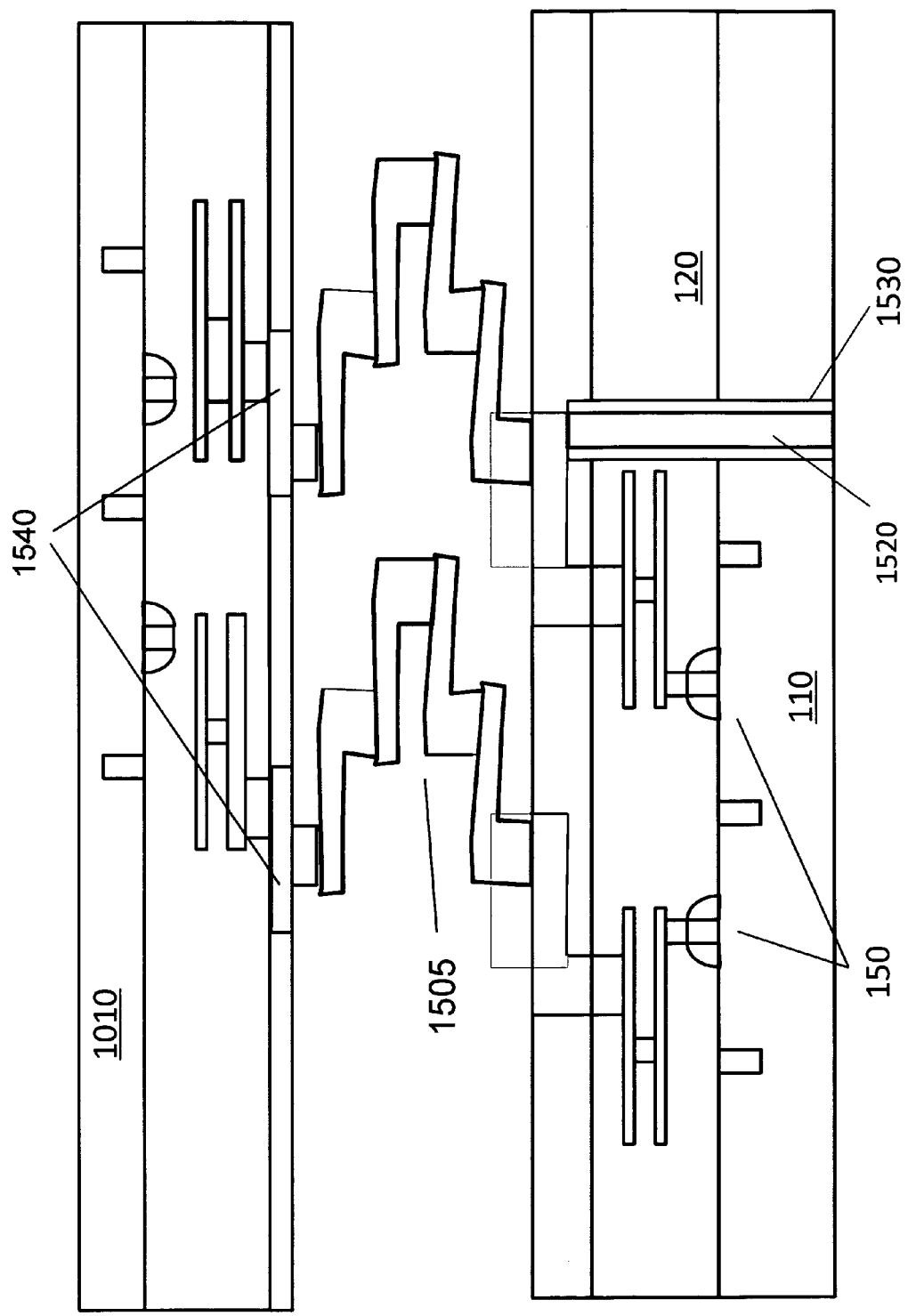

Referring to now FIG. 15, it shows the final cross-section of SACSs 1505 after the bonding steps shown in FIGS. 10(*a*), 10(*b*), 10(*c*), 11(*a*), 11(*b*), 12(*a*), and 12(*b*). It is noted that the top ends of SACSs 1405 are pressed down during a wafer bonding process and the arms in the SACSs 1405 are bended downward as well. If there is a void or open between the landing pad of the second wafer and the top surface of one, say SACS_v2, of the SACSs 1405, the amount of moving down of SACS_v2 top surface is smaller and then the void or open is eliminated, which improves 3D IC yields, electrical connectivity and reliability. In one embodiment, at least one through-semiconductor-via 1520 and insulative sidewall 1530 are formed in the first semiconductor structure 100 with conventional process steps.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multi-layer structure, comprising:
   (a) a first wafer including a plurality of landing pads;
   (b) a second wafer;
   (c) a first interconnect attached to the surface of the second wafer comprising a zigzag conductive chain interposed between the first wafer and the second wafer, the zigzag conductive chain including a via at its top, said via forming a bonding relation with a first landing pad of the first wafer, and;
   (d) a second interconnect attached to the surface of the second wafer, not disposed on a zigzag conductive chain, the second interconnect having a top surface,
   wherein the zigzag conductive chain is downward bent when the bonding relation is formed between the via and the first wafer, and
   wherein the top surface of the second interconnect is in contact with the first wafer when a bonding relation is formed between the second interconnect and the first wafer.

2. The multi-layer structure of claim 1, wherein at least a part of the zigzag conductive chain has staircase-like shape.

3. The multi-layer structure of claim 1, wherein a first end of the zigzag conductive chain approximately aligns, in a direction perpendicular to a surface of said first wafer, to a second end of the zigzag conductive chain.

4. The multi-layer structure of claim 1, wherein the zigzag conductive chain comprises at least one of Cu, W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, CrSi2, Ge, Mo, MoSi2, Pd, PdSi2, Pt, PtSi, TaSi2, Ti—Pt, Ti—W, TiSi2, W, WSi2, ZrSi2 and a combination thereof.

5. The multi-layer structure of claim 1, further comprising a bonding support layer between the first wafer and the second wafer.

6. The multi-layer structure of claim 5, wherein the bonding support layer comprises at least one of Cu, W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, $CrSi_2$, Ge, Mo, $MoSi_2$, Pd, $PdSi_2$, Pt, PtSi, $TaSi_2$, Ti—Pt, Ti—W, $TiSi_2$, W, $WSi_2$, $ZrSi_2$, Si3N4, silicon dioxide, fluorine doped silicon dioxide, carbon doped silicon dioxide, porous silicon dioxide, porous carbon doped silicon dioxide, porous SiLK, and a combination thereof.

7. The multi-layer structure of claim 1, wherein the zigzag conductive chain comprises:
- a first conductive via approximately perpendicular to a surface of the first wafer; a conductive bar extending in a direction approximately parallel to said surface of said first wafer, and
- a second conductive via approximately perpendicular to said surface of said first wafer,
- wherein the conductive bar has a first end or connecting to a top of the first conductive via, and the conductive bar has a second end connecting to a bottom of the second conductive via.

8. The multi-layer structure of claim 7, wherein the first conductive via comprises at least one of Cu, W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, CrSi2, Ge, Mo, MoSi2, Pd, PdSi2, Pt, PtSi, TaSi2, Ti—Pt, Ti—W, TiSi2, W, WSi2, ZrSi2 and a combination thereof.

9. The multi-layer structure of claim 7, wherein the conductive bar comprises at least one of Cu, W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, CrSi2, Ge, Mo, MoSi2, Pd, PdSi2, Pt, PtSi, TaSi2, Ti—Pt, Ti—W, TiSi2, W, WSi2, ZrSi2 and a combination thereof.

10. The multi-layer structure of claim 7, wherein the second conductive via comprises at least one of Cu, W, Al, Ni, WN, Ti, TiN, TaN, Ta, TiAl, Al—Si, Al—Cu, Al—Si—Cu, Cu—Sn, Cu—Si, Au, Au—Zn, Au—Ge, Cr, CrSi2, Ge, Mo, MoSi2, Pd, PdSi2, Pt, PtSi, TaSi2, Ti—Pt, Ti—W, TiSi2, W, WSi2, ZrSi2 and a combination thereof.

11. The multi-layer structure of claim 7, wherein the size of the first conductive via is approximately 50 nm to approximately 50000 nm.

12. The multi-layer structure of claim 7, wherein the conductive bar is approximately 50 nm to approximately 50000 nm in width, approximately 100 nm to approximately 100000 nm long, and approximately 50 nm to approximately 50000 nm thick.

13. The multi-layer structure of claim 7, wherein the size of the second conductive via is approximately 50 nm to approximately 50000 nm.

14. The multi-layer structure of claim 1, wherein the zigzag conductive chain is designed to reduce bonding interface stress, to increase bonding interface reliability, and to have an adjustable height to close opens or voids between at least one second end of the zigzag conductive chain and a device layer of said second wafer.

15. The multi-layer structure of claim 1, wherein the zigzag conductive chain directly abuts both the first wafer (a) and the second wafer (b).

16. A multi-layer structure, comprising:
- a first wafer;
- a second wafer; and
- a first interconnect comprising a zigzag conductive chain disposed between the first wafer and the second wafer; wherein said zigzag conductive chain includes a via disposed on top of the zigzag conductive chain;
- a second interconnect attached to a surface of the first wafer, not disposed on a zigzag conductive chain, the second interconnect having a top surface;
- wherein the first interconnect directly abuts the first wafer and forms a bonding relation with the first wafer and the via of the first interconnect directly abuts the second wafer and forms an electrical connection with the second wafer;
- wherein the first interconnect is downward bent to improve connection between the first wafer and the second wafer; and
- wherein the top surface of the second interconnect is in contact with the second wafer when a bonding relation is formed between the via and the second wafer.

17. The multi-layer structure of claim 16, wherein the first interconnect forms a bonding relation with an interconnect in the second wafer.

* * * * *